(12) United States Patent
Kanamori et al.

(10) Patent No.: US 12,096,637 B2
(45) Date of Patent: Sep. 17, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Kohji Kanamori, Seongnam-si (KR); Shinhwan Kang, Suwon-si (KR); Jeehoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 535 days.

(21) Appl. No.: 17/352,862

(22) Filed: Jun. 21, 2021

(65) Prior Publication Data

US 2022/0093631 A1    Mar. 24, 2022

(30) Foreign Application Priority Data

Sep. 23, 2020  (KR) .......................... 10-2020-0123056

(51) Int. Cl.
*H10B 43/50*  (2023.01)
*H10B 41/10*  (2023.01)
(Continued)

(52) U.S. Cl.
CPC ............. *H10B 43/50* (2023.02); *H10B 41/10* (2023.02); *H10B 41/27* (2023.02); *H10B 41/41* (2023.02);
(Continued)

(58) Field of Classification Search
CPC ........ H10B 43/50; H10B 41/10; H10B 41/27; H10B 41/41; H10B 41/50; H10B 43/10;
(Continued)

(56) References Cited

U.S. PATENT DOCUMENTS 9,929,174 B1 *  3/2018  Mizutani ................ H10B 43/35
10,361,216 B2    7/2019  Greenlee et al.
(Continued)

FOREIGN PATENT DOCUMENTS

| CN | 109817627 A | 5/2019 |
| CN | 110741475 A | 1/2020 |
| CN | 111146209 A | 5/2020 |

*Primary Examiner* — Allison Bernstein
(74) *Attorney, Agent, or Firm* — Harness, Dickey & Pierce, P.L.C.

(57) ABSTRACT

A semiconductor device includes a substrate; a stack structure on the substrate and including an alternating stack of interlayer insulating layers and gate electrodes; first and second separation regions each extending through the stack structure and extending in a first direction; a first upper separation region between the first and second separation regions and extending through a portion of the stack structure; a plurality of channel structures between the first and second separation regions and extending through the stack structure; and a plurality of first vertical structures each extending through a particular one of the first and second separation regions. Each of the first and second separation regions has a first width in a second direction that is perpendicular to the first direction. Each first vertical structure has a second width in the second direction, the second width being greater than the first width.

20 Claims, 20 Drawing Sheets

(51) Int. Cl.
  *H10B 41/27* (2023.01)
  *H10B 41/41* (2023.01)
  *H10B 41/50* (2023.01)
  *H10B 43/10* (2023.01)
  *H10B 43/27* (2023.01)
  *H10B 43/40* (2023.01)

(52) U.S. Cl.
  CPC ............. *H10B 41/50* (2023.02); *H10B 43/10* (2023.02); *H10B 43/27* (2023.02); *H10B 43/40* (2023.02)

(58) Field of Classification Search
  CPC ........ H10B 43/27; H10B 43/40; H10B 43/35; H10B 41/35; G11C 16/06; H01L 29/788; H01L 29/792
  See application file for complete search history.

(56) References Cited

U.S. PATENT DOCUMENTS

| | | |
|---|---|---|
| 10,510,764 B2 | 12/2019 | Tagami et al. |
| 10,615,172 B2 | 4/2020 | Nagata et al. |
| 10,644,015 B2 | 5/2020 | Dai et al. |
| 2019/0287994 A1 | 9/2019 | Tanaka et al. |
| 2020/0091188 A1 | 3/2020 | Lee |
| 2020/0127003 A1 | 4/2020 | Hua |
| 2020/0135754 A1 | 4/2020 | Lee |
| 2020/0135755 A1 | 4/2020 | Shin et al. |

\* cited by examiner

SEMICONDUCTOR DEVICES AND DATA STORAGE SYSTEMS INCLUDING THE SAME

CROSS-REFERENCE TO RELATED APPLICATION

This application claims benefit of priority to Korean Patent Application No. 10-2020-0123056 filed on Sep. 23, 2020 in the Korean Intellectual Property Office, the disclosure of which is incorporated herein by reference in its entirety.

BACKGROUND

The present inventive concepts relate to semiconductor devices and data storage systems including the same.

In a data storage system requiring data storage, a semiconductor device capable of storing high-capacity data is required. Accordingly, methods of increasing data storage capacity of a semiconductor device are being studied. For example, as one method for increasing data storage capacity of a semiconductor device, a semiconductor device including three-dimensionally arranged memory cells, instead of two-dimensionally arranged memory cells, has been proposed.

SUMMARY

Some example embodiments of the present inventive concepts provide a semiconductor device having improved reliability.

Some example embodiments of the present inventive concepts provide a data storage system including a semiconductor device having improved reliability.

According to some example embodiments of the present inventive concepts, a semiconductor device includes a substrate; a stack structure on the substrate, the stack structure including an alternating stack of interlayer insulating layers and gate electrodes; a first separation region and a second separation region, each of the first separation region and the second separation region extending through the stack structure and extending in a first direction; a first upper separation region between the first separation region and the second separation region and extending through a portion of the stack structure; a plurality of channel structures between the first separation region and the second separation region and extending through the stack structure; and a plurality of first vertical structures, each first vertical structure of the plurality of first vertical structures extending through a particular one of the first separation region or the second separation region, the plurality of first vertical structures collectively extending through each of the first separation region and the second separation region, wherein each of the first and second separation regions has a first width in a second direction, the second direction being perpendicular to the first direction, and wherein each of the plurality of first vertical structures has a second width in the second direction, the second width being greater than the first width.

According to some example embodiments of the present inventive concepts, a semiconductor device includes a substrate; a stack structure on the substrate and including an alternating stack of interlayer insulating layers and gate electrodes, alternately stacked in a direction perpendicular to an upper surface of the substrate; separation regions extending through the stack structure and further extending in a first direction; a plurality of channel structures extending through the stack structure; and a plurality of vertical structures extending through the stack structure, wherein at least one vertical structure among the plurality of vertical structures extends through at least one separation region of the separation regions.

According to some example embodiments of the present inventive concepts, a data storage system includes a semiconductor storage device; and a controller electrically connected to the semiconductor storage device and configured to control the semiconductor storage device, wherein the semiconductor storage device includes: a substrate; a stack structure on the substrate and including an alternating stack of interlayer insulating layers and gate electrodes, alternately stacked in a direction perpendicular to an upper surface of the substrate; separation regions extending through the stack structure and further extending in a first direction; a plurality of channel structures extending through the stack structure; and a plurality of vertical structures extending through the stack structure, wherein at least one vertical structure among the plurality of vertical structures extends through at least one separation region of the separation regions.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
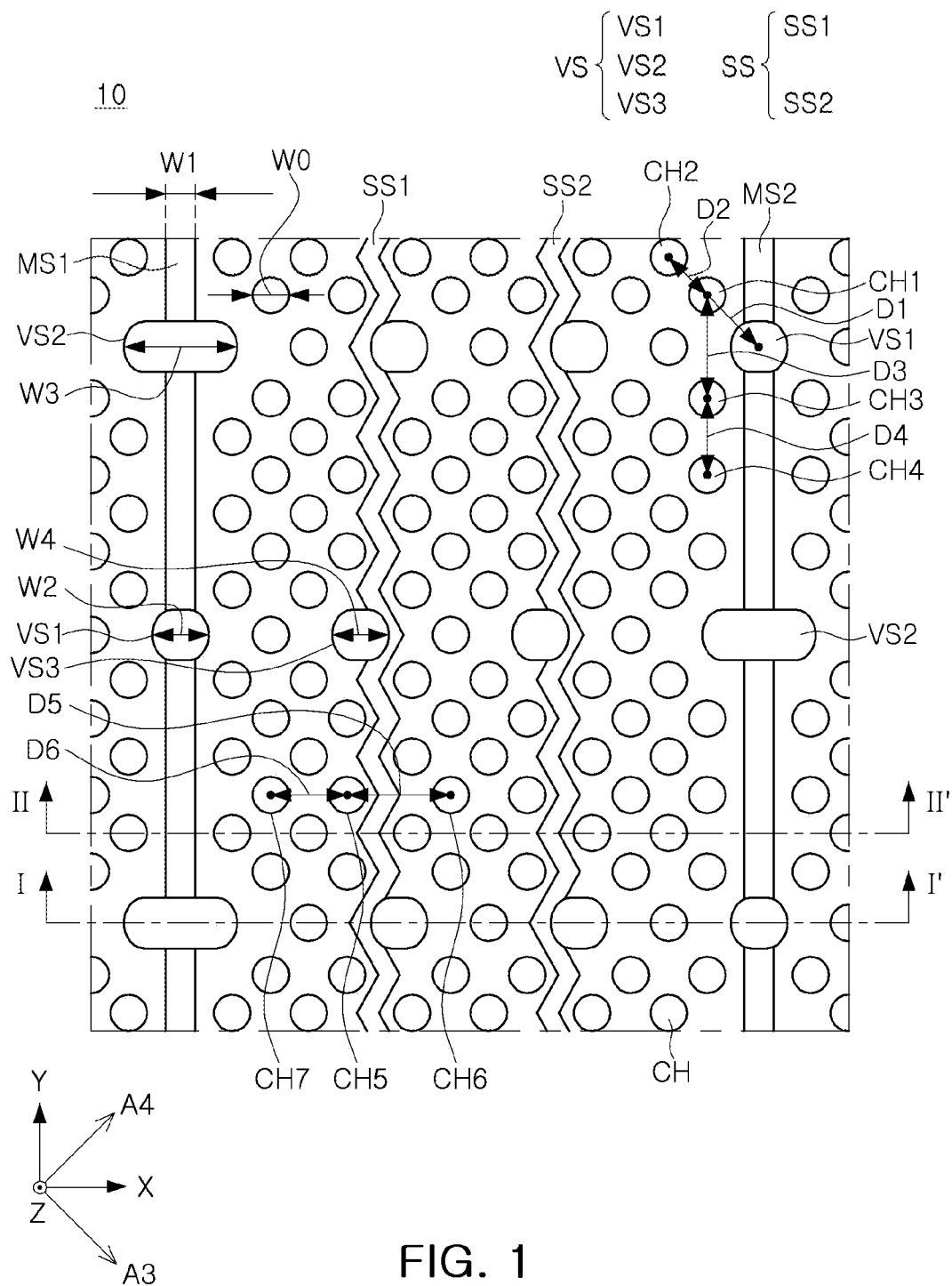
FIG. 1 is a plan view schematically illustrating a semiconductor device according to some example embodiments.

Hereinafter, some example embodiments of the present inventive concepts will be described with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a plan view schematically illustrating a semiconductor device according to some example embodiments.

Figure 2:
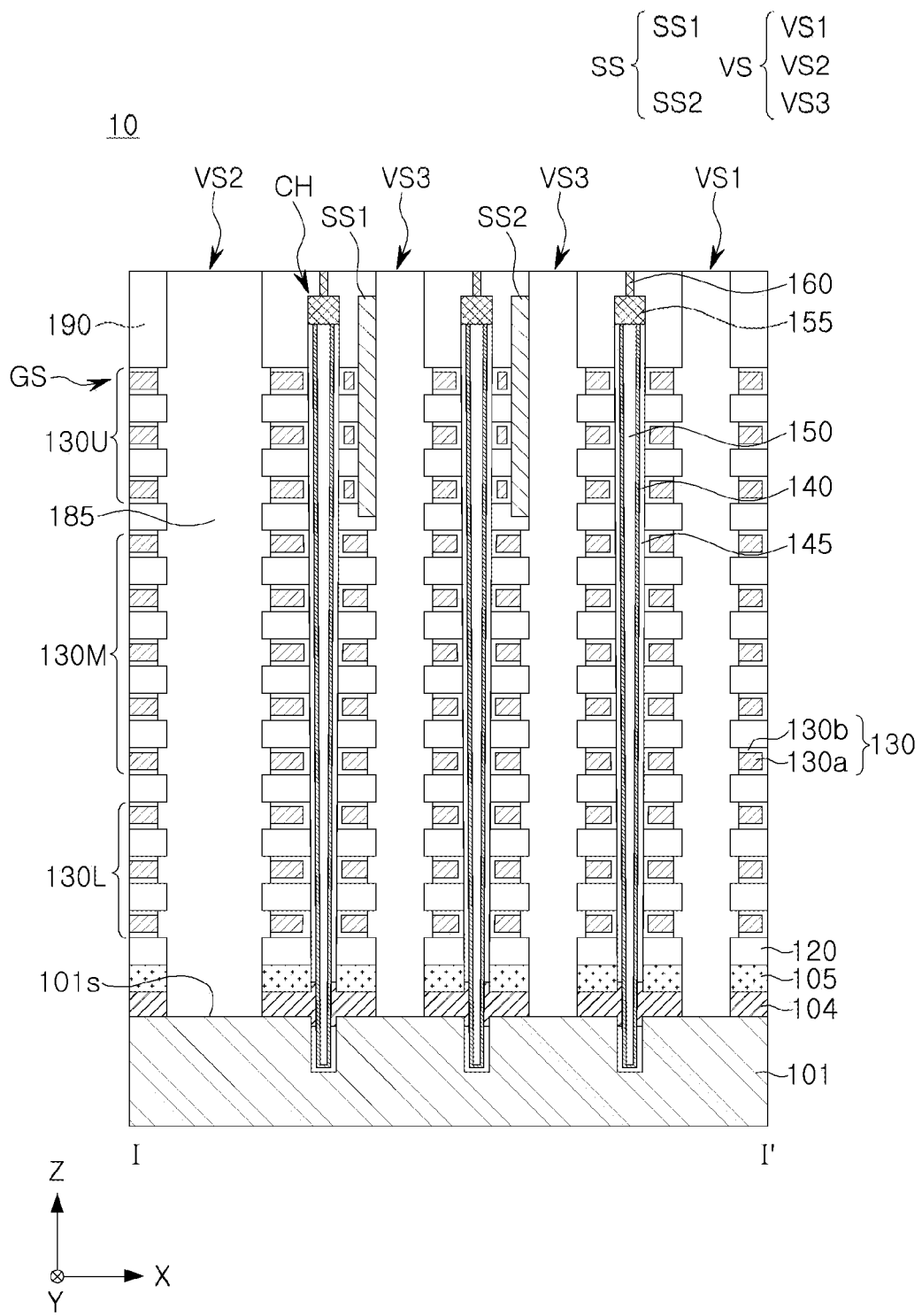
FIG. 2 is a cross-sectional view schematically illustrating a semiconductor device according to some example embodiments.
Figure 3:
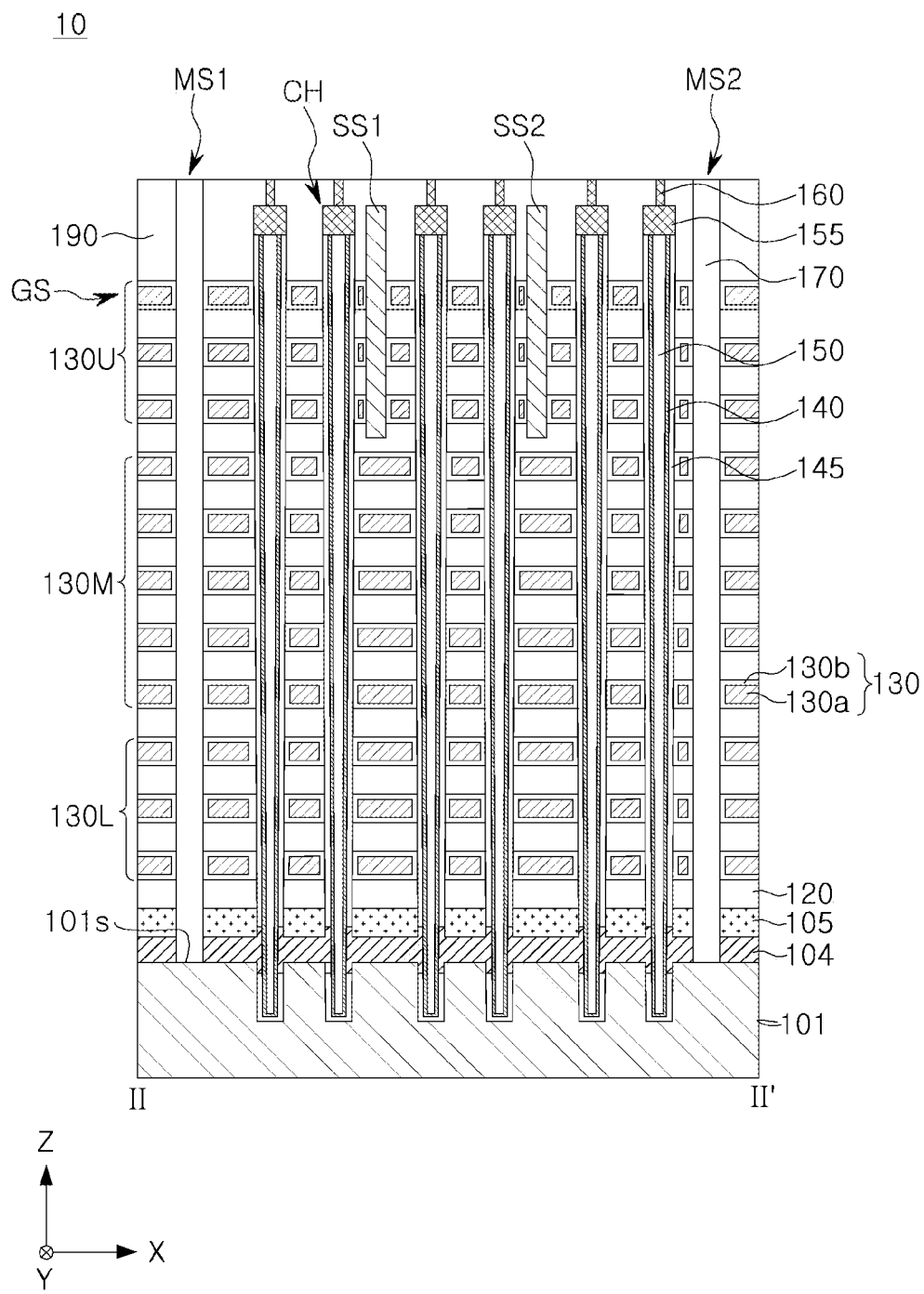
FIG. 3 is a cross-sectional view schematically illustrating a semiconductor device according to some example embodiments.

FIG. 2 is a cross-sectional view schematically illustrating a semiconductor device according to some example embodiments. FIG. 3 is a cross-sectional view schematically illustrating a semiconductor device according to some example embodiments. FIG. 2 is a cross-sectional view of FIG. 1, taken along line I-I', and FIG. 3 is a cross-sectional view of FIG. 1, taken along line II-II'.

Referring to FIGS. 1 to 3, a semiconductor device 10 may include a substrate 101; a stack structure GS disposed on the substrate 101 and including interlayer insulating layers 120 and gate electrodes 130, alternately and repeatedly stacked; a first separation region MS1 and a second separation region MS2, each of the first separation region MS1 and the second separation region MS2 passing (e.g., extending) through the stack structure GS and extending in a Y direction (e.g., a first direction); upper separation regions SS disposed between the first and second separation regions MS1 and MS2 (e.g., therebetween in the X direction) and each passing (e.g., extending) through a portion of the stack structure GS; channel structures CH between the first and second separation regions MS1 and MS2 and each passing (e.g., extending) through the stack structure GS; and vertical structures VS passing (e.g., extending) through the stack structure GS and passing (e.g., extending) through the first separation region MS1 and the second separation region MS2. At least a portion of the vertical structures VS may extend through one or more upper separation regions of the upper separation regions SS. As shown in FIGS. 1-3, at least one vertical structure VS may extend through at least one separation region of the separation regions SS. As shown in at least FIGS. 2 and 3, the stack structure GS, including interlayer insulating layers 120 and gate electrodes 130, alternately and repeatedly stacked, may be understood to be an alternating stack of the interlayer insulating layers 120 and the gate electrodes 130 which may be alternately stacked in a Z direction that is perpendicular to the upper surface 101s of the substrate 101.

The substrate 101 may have an upper surface 101s extending in X and Y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

First and second horizontal conductive layers 104 and 105 may be sequentially stacked and disposed on the substrate 101.

The first horizontal conductive layer 104 may function as a portion of a common source line of the semiconductor device 10, for example, may function as a common source line, together with the substrate 101. As illustrated in FIGS. 2 and 3, the first horizontal conductive layer 104 may be disposed around a channel layer 140 and may be directly connected to the channel layer 140. The second horizontal conductive layer 105 may be in contact with the substrate 101 in a region not illustrated, e.g., in some regions in which the first horizontal conductive layer 104 is not disposed.

The first and second horizontal conductive layers 104 and 105 may include a semiconductor material, and for example, both of the first and second horizontal conductive layers 104 and 105 may include polycrystalline silicon. In this case, at least the first horizontal conductive layer 104 may be a doped layer, and the second horizontal conductive layer 105 may be a doped layer or a layer containing impurities diffused from the first horizontal conductive layer 104. In some example embodiments, the second horizontal conductive layer 105 may be replaced with an insulating layer.

The interlayer insulating layers 120 may be spaced apart from each other in a direction, perpendicular to the upper surface of the substrate 101, and may be disposed to extend in the X direction. The interlayer insulating layers 120 may include an insulating material such as silicon oxide or silicon nitride.

The gate electrodes 130 may include a lower gate electrode 130L constituting a gate of a ground select transistor, memory gate electrodes 130M constituting a plurality of memory cells, and upper gate electrodes 130U constituting gates of string select transistors. The number of memory gate electrodes 130M constituting memory cells may be determined according to capacity of the semiconductor device 10. Depending on some example embodiments, the number of the upper and lower gate electrodes 130U and 130L may be 1 to 4 or more, respectively, and the upper and lower gate electrodes 130U and 130L may have the same as or a different structure to the memory gate electrodes 130M, respectively. In some example embodiments, the gate electrodes 130 may further include a gate electrode 130 disposed above the upper gate electrodes 130U and/or below the lower gate electrode 130L, and constituting an erase transistor used in an erase operation using a gate-induced-drain-leakage (GIDL) phenomenon. Also, a portion of the gate electrodes 130, for example, a portion of the memory gate electrodes 130M adjacent to the upper or lower gate electrodes 130U and 130L, may be dummy gate electrodes.

The gate electrodes 130 may be stacked to be vertically spaced apart from each other, and may extend to have different lengths on at least one region, to form a stepped structure. The gate electrodes 130 may have lateral surfaces, recessed, as compared to lateral surfaces of the interlayer insulating layers 120, from the vertical structures VS.

Each of the gate electrodes 130 may include a first layer 130a and a second layer 130b. The first layer 130a may have any lateral surface contacting the vertical structures VS. The second layer 130b may cover upper and lower surfaces of the first layer 130a, and may cover a lateral surface of the first layer 130a that do not contact the vertical structures VS. In the gate electrodes 130 contacting the first and second separation regions MS1 and MS2, the second layer 130b may cover a lateral surface of the first layer 130a, facing the first and second separation regions MS1 and MS2. In a gate electrode 130 disposed between the upper separation region SS and the channel structures CH, a second layer 130b may cover a lateral surface of a first layer 130a, facing the upper separation region SS and the channel structures CH.

In some example embodiments, each of the gate electrodes 130 may be replaced with a structure including a first layer 130a formed of a conductive material layer and a second layer 130b formed of an insulating material layer. For example, the first layer 130a may include a conductive material such as TiN, WN, Ti, W, or the like, and the second layer 130b may include a high-k dielectric such as AlO or the like.

In another example, the first layer 130a may include a first conductive material (e.g., TiN, W, or the like), and the second layer 130b may include a second conductive material (e.g., Ti, W, or the like), different from the first conductive material.

In another example, each of the first and second layers 130a and 130b may be formed of a doped polysilicon, a metal-semiconductor compound (e.g., TiSi, TaSi, CoSi, NiSi or WSi), a metal nitride (e.g., TiN, TaN, or WN), or metal (e.g., Ti or W).

Each of the first and second separation regions MS1 and MS2 may be disposed to pass through stack structure GS to extend in the Y direction. The first and second separation regions MS1 and MS2 may be disposed parallel to each other. The first and second separation regions MS1 and MS2 may pass entirely through the gate electrodes 130 stacked on the substrate 101, to be connected to the substrate 101.

As illustrated in FIG. 3, a separation layer 170 may be disposed in the first and second separation regions MS1 and MS2. The separation layer 170 may have a shape of which a width decreases toward the substrate 101 due to a relatively high aspect ratio, but is not limited thereto, and may have a lateral surface, perpendicular to the upper surface of the substrate 101.

In some example embodiments, the separation layer 170 may be formed of an insulating material layer.

In some example embodiments, the separation layer 170 may include a conductive layer, and an insulating material layer on a lateral surface of the conductive layer.

The upper separation regions SS may include a first upper separation region SS1 and a second upper separation region SS2, disposed between the first and second separation regions MS1 and MS2, where the second upper separation region SS2 may be between the first upper separation region SS1 and the second separation region MS2. In FIGS. 2 and 3, the upper separation regions SS are illustrated to include two (2) upper separation regions SS between the first and second separation regions MS1 and MS2, but are not limited thereto, and the number (e.g., quantity) of upper separation regions SS may be variously changed. As illustrated in FIG. 1, the upper separation regions SS may be disposed between the first and second separation regions MS1 and MS2, and may extend in the Y direction. Each of the upper separation regions SS may be arranged in a zigzag shape on a plan view. In some example embodiments, the upper separation regions SS may be arranged in a straight linear shape.

The upper separation regions SS1 and SS2 may each be disposed to pass (e.g., extend) through a portion of the stack structure, for example through a portion of the gate electrodes 130 including the upper gate electrode 130U in an uppermost portion of the gate electrodes 130. The upper separation regions SS1 and SS2 may separate three (3) gate electrodes 130 from each other in the X direction, including, for example, the upper gate electrodes 130U, as illustrated in FIGS. 2 and 3. The number of gate electrodes 130 separated by the upper separation regions SS1 and SS2 may be variously changed in some example embodiments. The upper gate electrodes 130U separated by the upper separation regions SS1 and SS2 may form different string select lines. The upper separation regions SS1 and SS2 may include an insulating material. The insulating material may include, for example, silicon oxide, silicon nitride, or silicon oxynitride.

Each of the channel structures CH may constitute (e.g., may include) one (1) memory cell string, and may be spaced apart from each other while forming a row and a column. The channel structures CH may be disposed between the first and second separation regions MS1 and MS2. The channel structures CH may be disposed between the first separation region MS1 and the first upper separation region SS1, between the second separation region MS2 and the second upper separation region SS2, and between the first upper separation region SS1 and the second upper separation region SS2. The channel structures CH may be disposed to form a grid pattern, or may be disposed in a zigzag shape in one direction. Each of the channel structures CH may have a pillar shape, and may have an inclined lateral surface that becomes narrower as it approaches the substrate 101, according to an aspect ratio. A portion of the channel structures CH may be dummy channels. In this case, the dummy channels may have the same or similar structure as the channel structures CH, but may not perform a practical function in the semiconductor device 10.

The channel structures CH may include a first channel structure CH1 adjacent to one (1) first vertical structure VS1 among the plurality of first vertical structures VS1 in a third direction A3, a diagonal direction between a first direction (e.g., the Y direction) and a second direction (e.g., the X direction), for example at a 45-degree angle to each of the orthogonal Y and X directions, and a second channel structure CH2 adjacent to the first channel structure CH1 in the third direction. The one (1) first vertical structure VS1 among the plurality of first vertical structures VS1, the first channel structure CH1, and the second channel structure CH2 may be sequentially arranged in the third direction A3. The first channel structure CH1 may be adjacent to the first vertical structure VS1 in the third direction A3, and may be disposed between the first vertical structure VS1 and the second channel structure CH2. A center of the first channel structure CH1 may be spaced apart from a center of the first vertical structure VS1 by a first distance D1, and a center of the second channel structure CH2 may be spaced apart from the center of the first channel structure CH1 by a second distance D2, where the second distance D2 is less than the first distance D1.

The channel structures CH may include a pair of channel structures CH sequentially arranged from one (1) second vertical structure VS2 among the plurality of second vertical structures VS2 in the third direction. In addition, a distance between a center of a channel structure CH adjacent to the second vertical structure VS2, among the pair of channel structures CH, and a center of the second vertical structure VS2 may be greater than a distance between centers of the pair of channel structures CH.

The channel structures CH may include a pair of channel structures CH sequentially arranged from one (1) third vertical structure VS3 among the plurality of third vertical structures VS3 in the third direction. In addition, a distance between a center of a channel structure CH adjacent to the third vertical structures VS3, among the pair of channel structures CH, and a center of the third vertical structures VS3 may be greater than a distance between centers of the pair of channel structures CH.

Figure 10A:
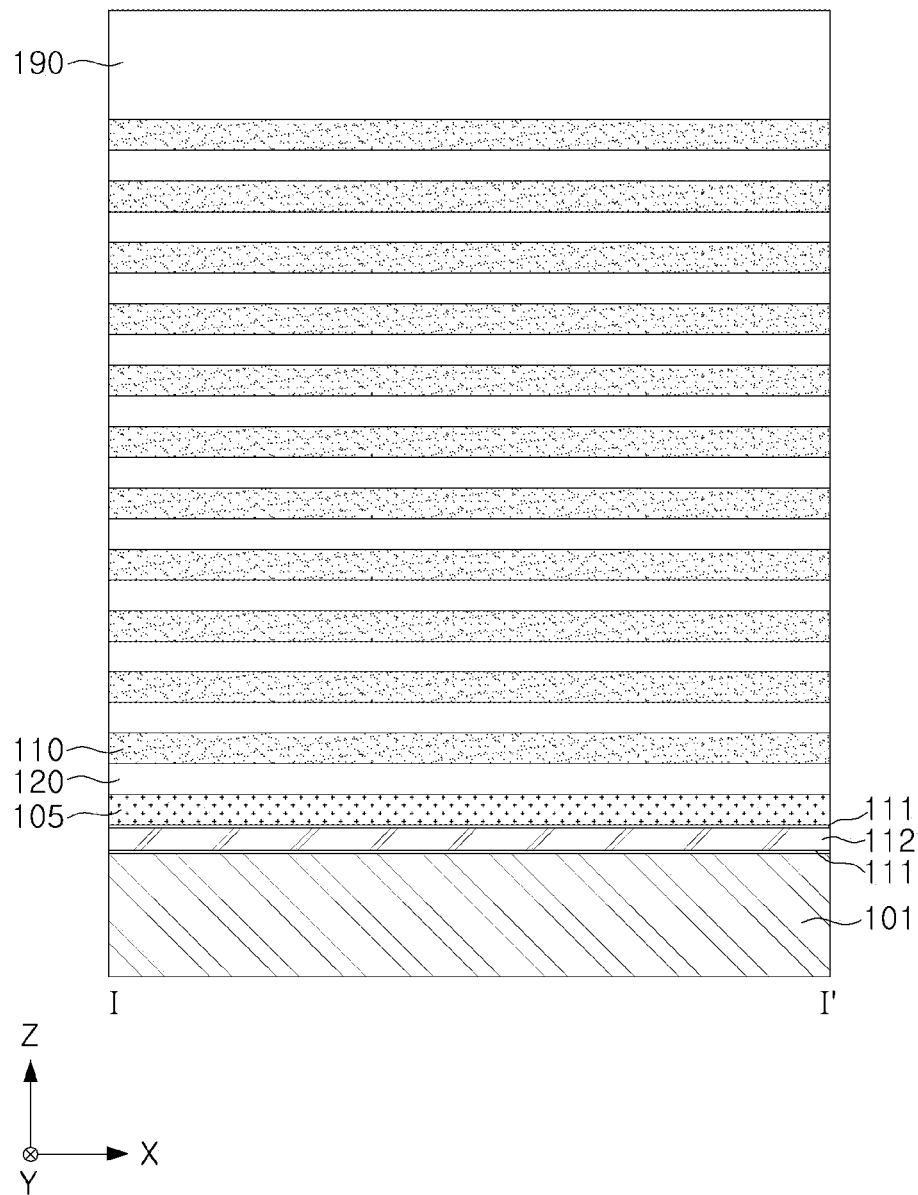
FIGS. 10A, 10B, 10C, and 10D schematically illustrate a method of manufacturing a semiconductor device according to some example embodiments.
Figure 10B:
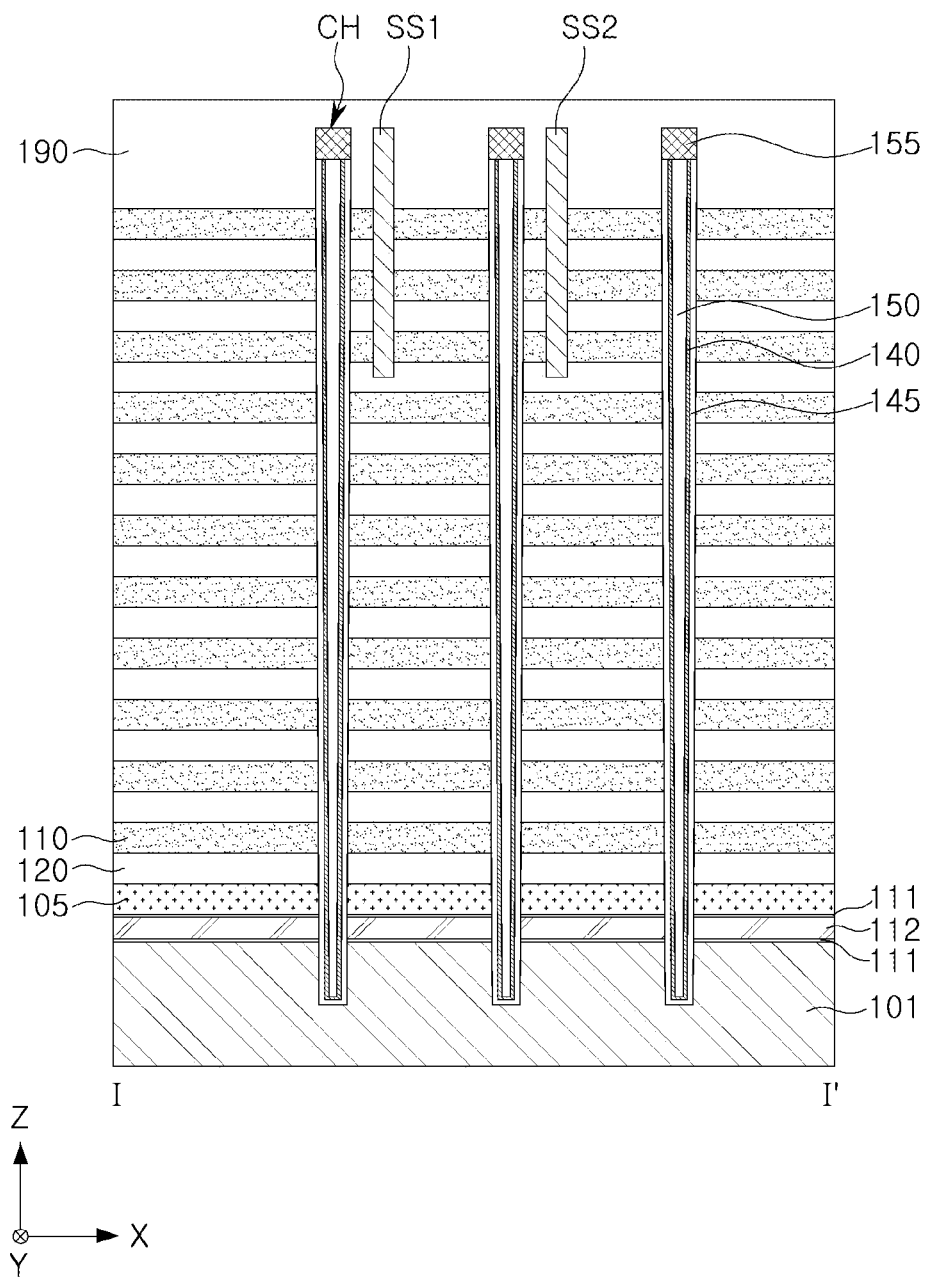
Figure 10C:
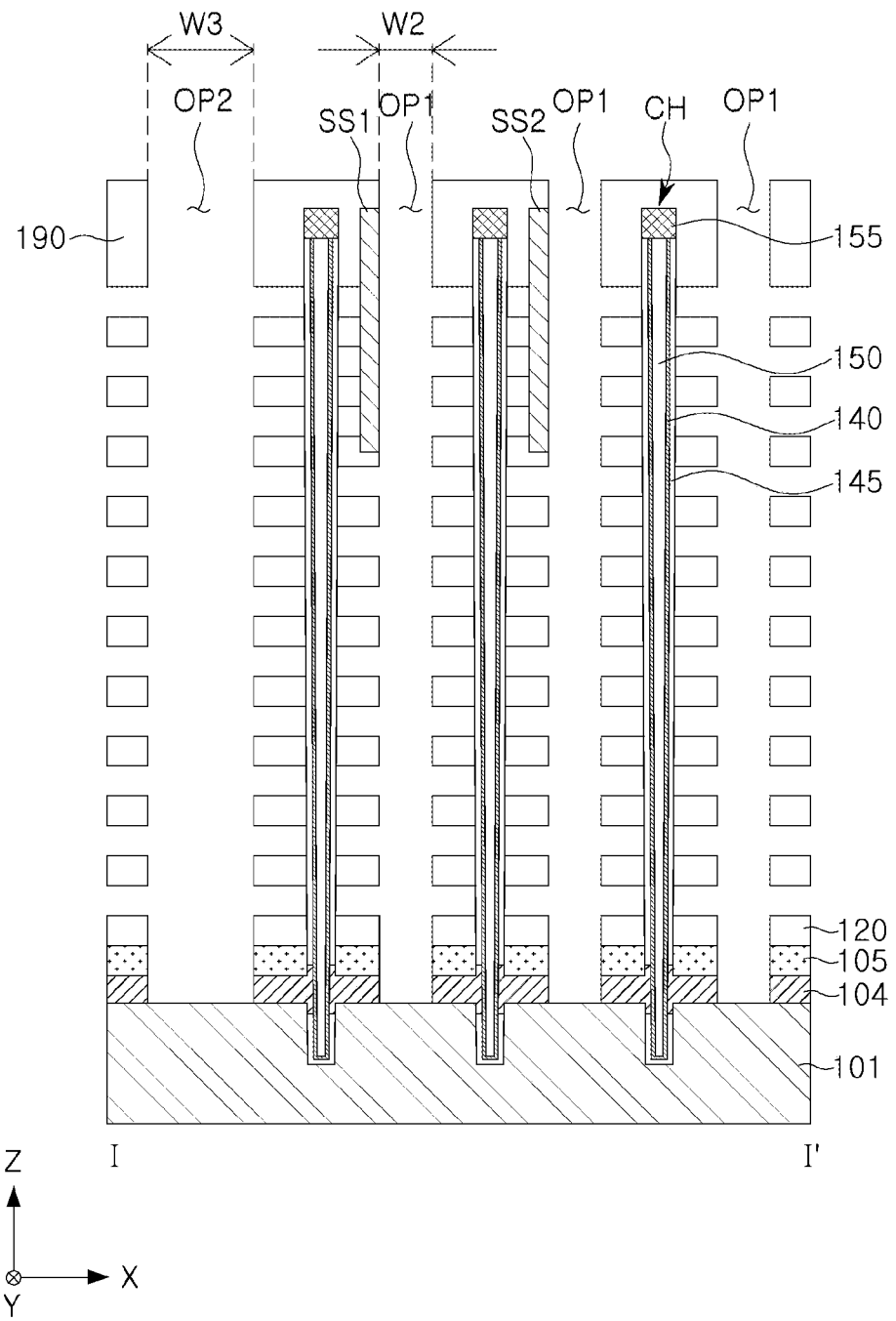

In an etching process and a replacement process of a horizontal insulating layer 110, illustrated in FIG. 10C, a distance between openings OP, formed at positions corresponding to vertical structures VS, and channel structures CH may be disposed to be equal to or greater than a predetermined interval, to secure an etching margin.

The channel structures CH may further include a third channel structure CH3 adjacent to the first vertical structure VS1 in a fourth direction A4, perpendicular to the third direction, a diagonal direction between the first direction (e.g., the Y direction) and the second direction (e.g., the X direction) for example at a 45-degree angle to each of the orthogonal Y and X directions, and adjacent to the first channel structure CH1 in the first direction (e.g., the Y direction). Further, the channel structures CH may further include a fourth channel structure CH4 adjacent to third channel structure CH3 in the first direction (e.g., the Y direction). The third channel structure CH3 may be disposed between the fourth channel structure CH4 and the first channel structure CH1. The first channel structure CH1, the third channel structure CH3, and the fourth channel structure CH4 may be sequentially arranged in the first direction (e.g., the Y direction). A center of the third channel structure CH3 may be spaced apart from the center of the first channel structure CH1 by a third distance D3 in the first direction (e.g., the Y direction), and a center of the fourth channel structure CH4 may be spaced apart from the center of the third channel structure CH3 by a fourth distance D4, where the fourth distance D4 is less than the third distance D3, in the first direction.

The plurality of channel structures CH may include a pair of channel structures sequentially arranged in the first direction (e.g., the Y direction) and adjacent to the second vertical structure VS2 in the third and fourth directions. A separation distance between the pair of channel structures in the first direction (e.g., the Y direction) may be greater than a separation distance between other channel structure, adjacent to the pair of channel structures in the first direction, and the pair of channel structures in the first direction (e.g., the Y direction).

The plurality of channel structures CH may include a pair of channel structures sequentially arranged in the first direction (e.g., the Y direction) and adjacent to the third vertical structure VS3 in the third and fourth directions. A separation distance between the pair of channel structures in the first direction (e.g., the Y direction) may be greater than a separation distance between other channel structure, adjacent to the pair of channel structures in the first direction, and the pair of channel structures in the first direction (e.g., the Y direction).

As distances between channel structures adjacent to each of the vertical structures VS1, VS2, and VS3 in the Y direction become relatively large, distances between centers of the vertical structures VS1, VS2, and VS3 and channel structures adjacent to each of the vertical structures VS1, VS2, and VS3 in the third direction may increase.

The channel structures CH may further include at least three channel structures CH5, CH6, and CH7, sequentially arranged in the X direction. A portion of the upper separation region SS (e.g., portion of the first upper separation region SS1) may be disposed between a pair of channel structures CH5 and CH6 adjacent to each other in the X direction (e.g., between a pair of X direction-adjacent channel structures CH5 and CH6), among the at least three channel structures CH5, CH6, and CH7. A distance D5 between the pair of channel structures CH5 and CH6 adjacent to each other in the X direction may be greater than a distance D6 between any one channel structure CH7 adjacent the pair of channel structures CH5 and CH6 in the X direction and at least one of the pair of channel structures CH5 and CH6. A pair of adjacent channel structures CH5 and CH6 with the upper separation region SS interposed therebetween may be disposed asymmetrically from the upper separation region SS, respectively. For example, a pair of adjacent channel structures CH5 and CH6 with the upper separation region SS interposed therebetween may be disposed to be spaced apart from the upper separation region SS by different distances, respectively. In some example embodiments, a distance D5 between the pair of channel structures CH5 and CH6 adjacent to each other in the X direction may be substantially equal to a distance D6 between any one channel structure CH7 adjacent the pair of channel structures CH5 and CH6 in the X direction and at least one of the pair of channel structures CH5 and CH6.

Figure 4:
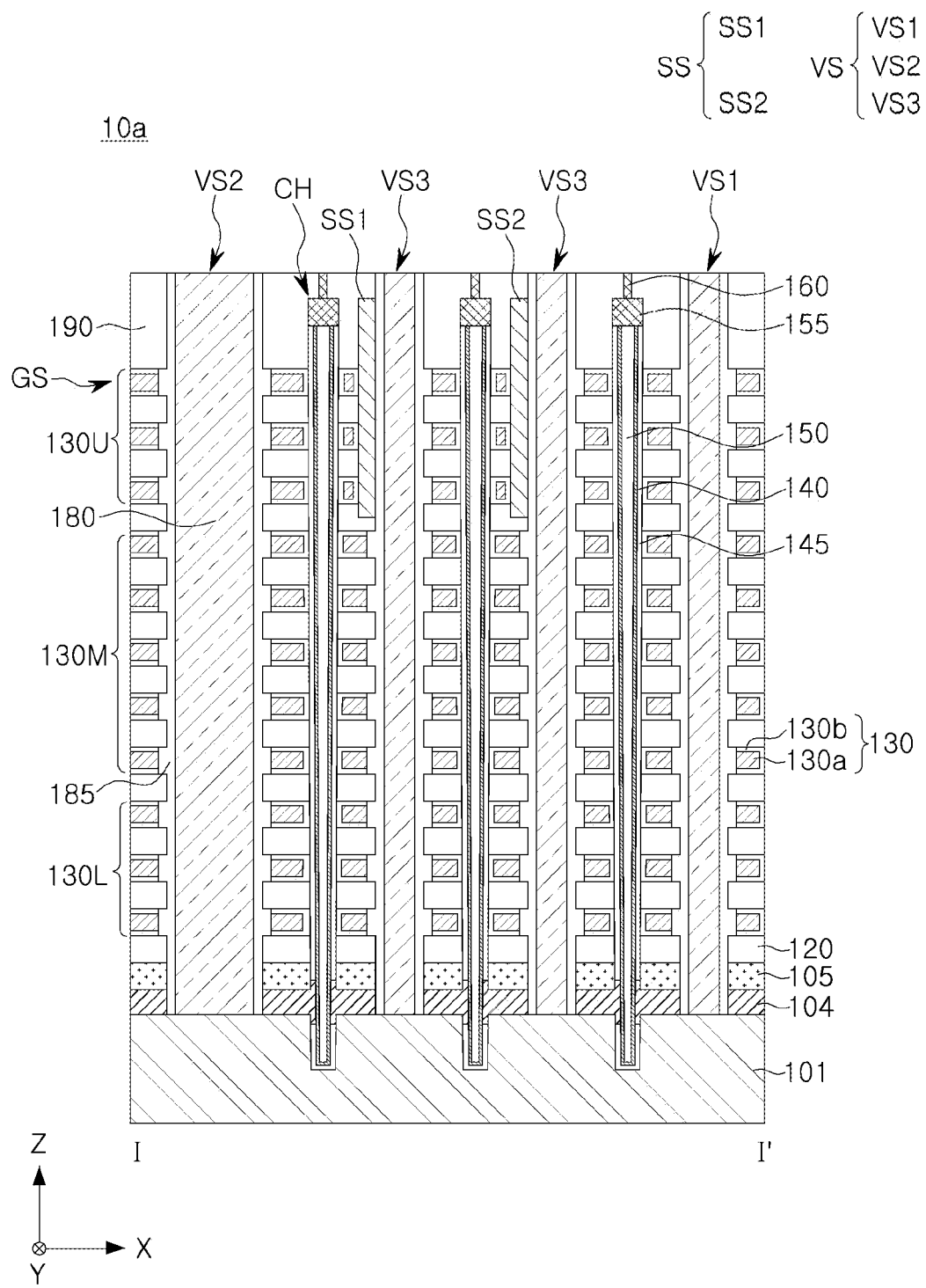
FIG. 4 is a cross-sectional view schematically illustrating a semiconductor device according to some example embodiments.

As illustrated in FIGS. 2 to 4, a channel layer 140 may be disposed in the channel structures CH. In the channel structures CH, the channel layer 140 may be formed in an annular shape surrounding a channel embedded insulating layer 150. According to some example embodiments, the channel layer 140 may be formed in a pillar shape such as a cylinder shape or a prism shape without the channel embedded insulating layer 150. A lower portion of the channel layer 140 may be connected to the first horizontal conductive layer 104. The channel layer 140 may include a semiconductor material such as polycrystalline silicon or single crystal silicon.

A channel pad 155 may be disposed only on an upper end of the channel structure CH. Channel pads 155 may be disposed to cover an upper surface of the channel embedded insulating layer 150 and to be electrically connected to the channel layer 140. The channel pads 155 may include, for example, doped polycrystalline silicon.

A gate dielectric layer 145 may be disposed between the gate electrodes 130 and the channel layer 140. Although not specifically illustrated, the gate dielectric layer 145 may include a tunneling layer, a charge storage layer, and a blocking layer, sequentially stacked from the channel layer 140. The tunneling layer may tunnel charges to the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend along the gate electrodes 130 in a horizontal direction.

In some example embodiments, the number of stack structures and the number of channel structures, stacked in the Z direction, may be variously changed.

Each of the vertical structures VS may include a first vertical structure VS1, a second vertical structure VS2, and a third vertical structure VS3, passing (e.g., extending) through the stack structure GS. Each of the first vertical structures VS1 and the second vertical structures VS2 may pass (e.g., extend) through each of the first and second separation regions MS1 and MS2. In some example embodiments, each of the first vertical structures VS1 and the second vertical structures VS2 may respectively extend through a particular one of the first or second separation regions MS1 or MS2. For example, as shown in at least FIG. 1, each first vertical structure VS1 may extend through a particular one of the first or second separation regions MS1 or MS2, and the plurality of first vertical structures VS1 may collectively extend through each of the first and second separation regions MS1 and MS2. For example, as shown in at least FIG. 1, each second vertical structure VS2 may extend through a particular one of the first or second separation regions MS1 or MS2, and the plurality of second vertical structures VS2 may collectively extend through each of the first and second separation regions MS1 and MS2. The third vertical structure VS3 may be in contact with the upper separation region SS (e.g., the first and/or second upper separation regions SS1 and/or SS2). The third vertical structure VS3 may be spaced apart from (e.g., isolated from direct contact with) any one (e.g., at least one) lateral surface among opposite lateral surfaces of the upper separation region SS (e.g., opposite vertical sidewall surfaces extending in at least the Z direction of the first upper separation region SS1 and/or the second upper separation region SS2). The vertical structures VS may be alternately arranged with the channel structures CH in the X direction. The first vertical structures VS1 and the second vertical structures VS2 may be alternately arranged in the Y direction. The third vertical structures VS3 may include a third vertical structure VS3 spaced apart from any one lateral surface among the opposite lateral surfaces of the upper separation region SS, and a third vertical structure VS3 spaced apart from the other lateral surface among the opposite lateral surfaces of the upper separation region SS. The third vertical structure VS3 spaced apart from any one lateral surface among the opposite lateral surfaces of the upper separation region SS and the third vertical structure VS3 spaced apart from the other lateral surface among the opposite lateral surfaces of the upper separation region SS may be arranged alternately in the Y direction. The vertical structures VS may be disposed to pass through the first and second separation regions MS1 and MS2, respectively, and to contact the upper separation regions SS1 and SS2, respectively, to reduce occurrence of defects such as voids or the like in a process of forming the gate electrodes 130, illustrated in FIGS. 10C and 10D. The third vertical structures VS3 contacting the upper separation regions SS and passing through the stack structure GS may be disposed to increase a degree of integration of a semiconductor device. The third vertical structures VS3 contacting the upper separation regions SS may allow the gate electrodes 130 disposed between the upper separation regions SS to be stably formed.

Each of the vertical structures VS may have widths W2, W3, and W4, greater than a width W0 of each of the channel structures CH. Each of the first and second separation regions MS1 and MS2 may have a first width W1 in the X direction (which is perpendicular to the Y direction), and each of the first vertical structures VS1 may have a second width W2, greater than the first width W1, in the X direction. Each of the second vertical structures VS2 may have a third width W3, greater than the first width W1 of the first and second separation regions MS1 and MS2, in the X direction. Each of the second vertical structures VS2 may have a third width W3, greater than the second width W2 of the first vertical structures VS1, in the X direction. A width W4 of each of the third vertical structures VS3 may be identical or substantially identical to the second width W2 of each of the first vertical structures VS1. A width of each of the vertical structures VS in the X direction may be different from a width of each of the vertical structures VS in the Y direction. The third vertical structure VS3 contacting the upper separation region SS adjacent to the second vertical structure VS2 having a relatively large width may be spaced apart from a lateral surface of the upper separation region SS adjacent to the second vertical structure VS2, among the both lateral surfaces of the upper separation region SS. The third vertical structure VS3 contacting the upper separation region SS adjacent to the first vertical structure VS1 having a relatively small width may be spaced apart from a lateral surface of the upper separation region SS farther away from the second vertical structure VS2, among the both lateral surfaces of the upper separation region SS.

The vertical structures VS may include an insulating pattern 185, as illustrated in FIG. 2. The insulating pattern 185 of each of the vertical structures VS may have a protrusion in which a lateral surface contacting the gate electrodes 130 protrudes toward the gate electrode 130, as compared to a lateral surface contacting the interlayer insulating layers 120. The insulating pattern 185 may include, for example, silicon oxide, silicon nitride, or silicon oxynitride.

Upper surfaces of the vertical structures VS may be disposed on a level higher than upper surfaces of the upper separation regions SS. The insulating patterns 185 of each of the vertical structures VS may be formed of the same material or of a different material as an insulating material of the upper separation regions SS. A boundary between each of the vertical structures VS and each of the upper separation regions SS may or may not be distinguished.

A channel contact plug 160 may pass through a cell region insulating layer 190, and may be electrically connected to each of the channel structures CH. The channel contact plug 160 may include a conductive material, for example, tungsten (W), copper (Cu), aluminum (Al), or the like, and may further include a diffusion barrier layer.

The cell region insulating layer 190 may be disposed on the stack structure GS of the gate electrodes 130, and may include an insulating material such as silicon oxide, silicon nitride, or the like.

Components having the same reference numerals of FIGS. 1 to 3 among components illustrated in FIGS. 4 to 9 described below may be similar to the components illustrated in FIGS. 1 to 3, and descriptions thereof will be omitted.

FIG. 4 is a cross-sectional view schematically illustrating a semiconductor device according to some example embodiments.

Referring to FIG. 4, vertical structures VS in a semiconductor device 10a may include a sidewall insulating pattern 185 forming a sidewall of each of the vertical structures VS, and a conductive pattern 180 disposed in the sidewall insulating pattern 185. The conductive pattern 180 may include a conductive material. The sidewall insulating pattern 185 of each of the vertical structures VS may have a protrusion in which a lateral surface contacting gate electrodes 130 protrudes toward the gate electrode 130, as compared to a lateral surface contacting interlayer insulating layers 120. The conductive pattern 180 may function as a common source line of the semiconductor device 10a, or may function as a contact plug connected to the common source line.

Figure 5:
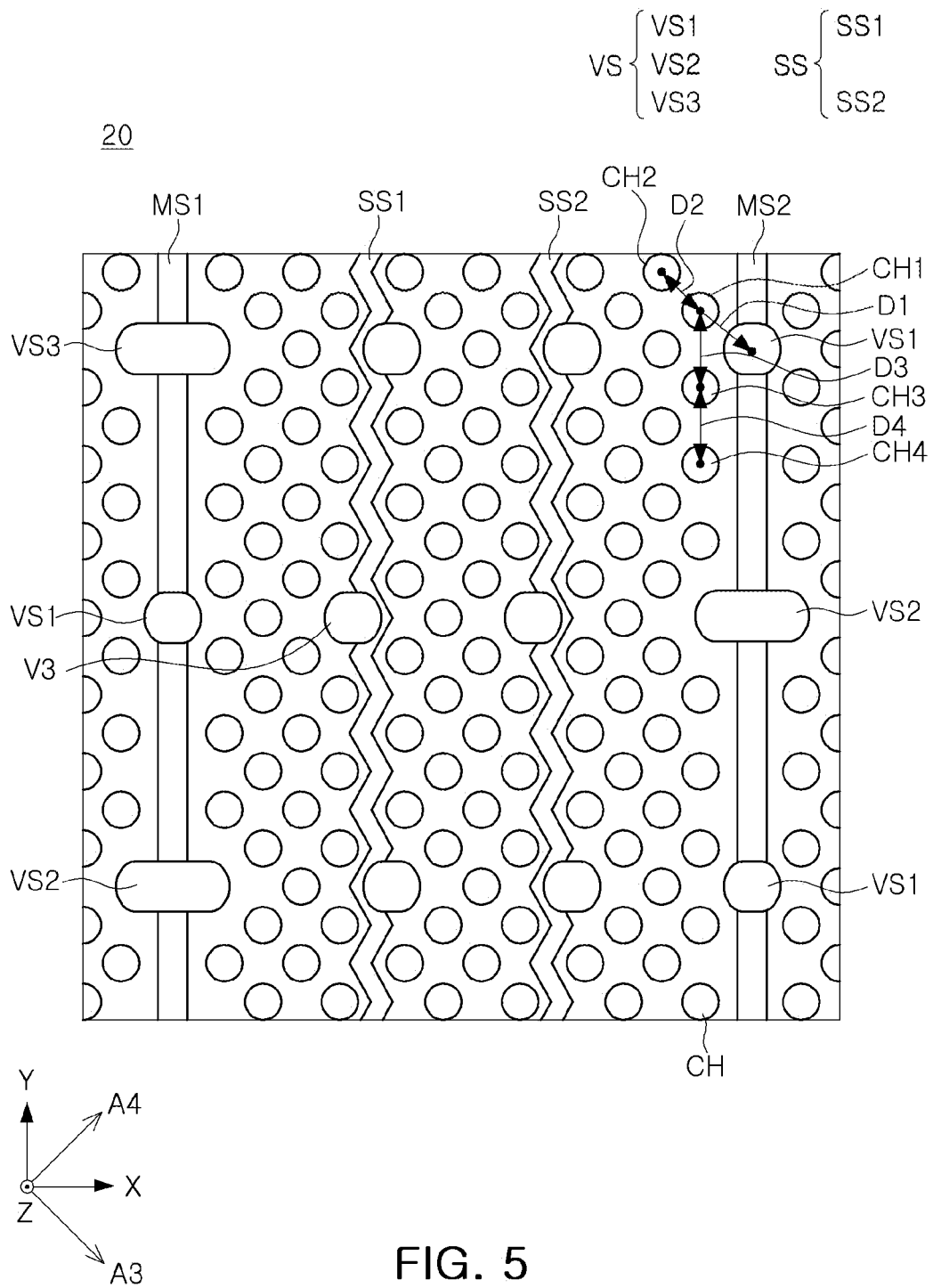
FIG. 5 is a plan view schematically illustrating a semiconductor device according to some example embodiments.

FIG. 5 is a plan view schematically illustrating a semiconductor device according to some example embodiments.

Referring to FIG. 5, in a semiconductor device 20, a center of a first channel structure CH1 may be spaced apart from a center of a first vertical structure VS1 by a first distance D1, and a center of a second channel structure CH2 may be spaced apart from the center of the first channel structure CH1 by a second distance D2, the second distance D2 being equal or substantially equal to the first distance D1. Centers of second and third vertical structures VS2 and VS3 may be respectively spaced apart from a center of a channel structure CH adjacent to each of the second and third vertical structures VS2 and VS3 in the third direction A3, a diagonal direction between the first direction (e.g., the Y direction) and the second direction (e.g., the X direction), by the first distance D1, similarly to the first vertical structure VS1. In addition, the center of the channel structure CH adjacent to the second and third vertical structures VS2 and VS3 in the third direction may be spaced apart from the center of the channel structure CH adjacent to the second and third vertical structures VS2 and VS3 by a distance, substantially equal to the first distance. For example, a channel structure CH respectively adjacent to the vertical structures VS1, VS2, and VS3 in the third direction A3 may be respectively spaced apart from the vertical structures VS1, VS2, and VS3 by a distance, substantially equal to a distance between channel structures CH, not adjacent to the vertical structures VS1, VS2, and VS3. When a distance between centers of channel structures CH is substantially equal to a distance between a center of a channel structure CH and a center of a vertical structure VS, a degree of integration of a semiconductor device may be improved.

A center of a third channel structure CH3 may be disposed to have a third distance D3 from the center of the first channel structure CH1 in the first direction (e.g., the Y direction). A center of a fourth channel structure CH4 may be disposed to be spaced apart from the center of the third channel structure CH3 by a fourth distance D4, equal or substantially equal to the third distance D3 in the first direction. A distance between channel structures CH adjacent to the second and third vertical structures VS2 and VS3, respectively, in the third and fourth directions may be equal or substantially equal to a distance between a channel structure CH not adjacent to the second and third vertical structures VS2 and VS3 and a channel structure CH adjacent to the second and third vertical structures VS2 and VS3. A distance in the Y direction between channel structures CH adjacent to the vertical structures VS1, VS2, and VS3, respectively, in the third and fourth directions may be substantially equal to a distance between a channel structure CH not adjacent to the vertical structures VS1, VS2, and VS3 and a channel structure CH adjacent to the vertical structures VS1, VS2, and VS3.

Figure 6:
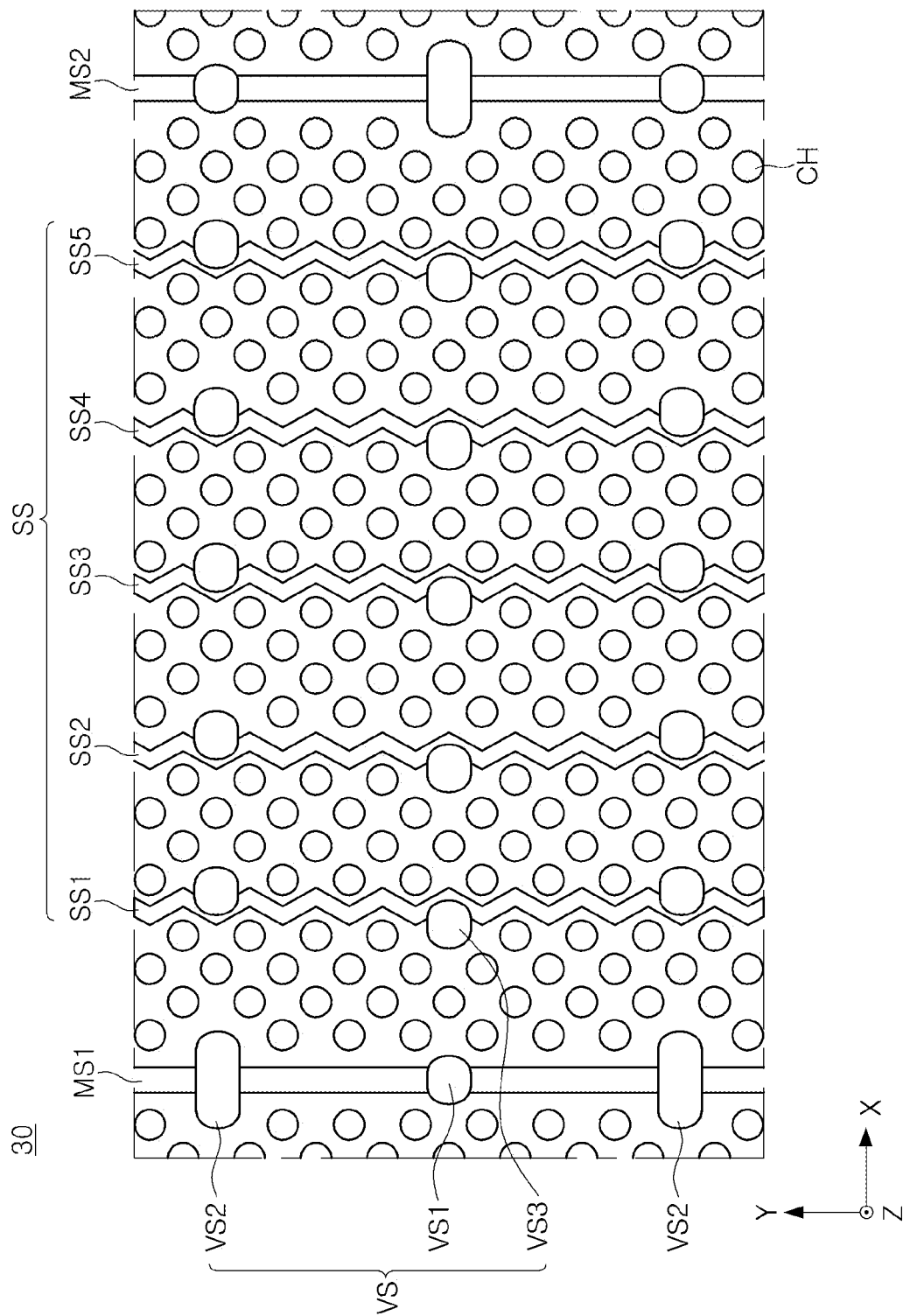
FIG. 6 is a plan view schematically illustrating a semiconductor device according to some example embodiments.

FIG. 6 is a plan view schematically illustrating a semiconductor device according to some example embodiments.

Referring to FIG. 6, in a semiconductor device 30, an upper separation region SS may include first to fifth upper separation regions SS1, SS2, SS3, SS4, and SS5 between first and second separation regions MS1 and MS2. For example, the upper separation region SS may include five (5) upper separation regions SS between the first and second separation regions MS1 and MS2. In addition, third vertical structures VS3 respectively contacting the upper separation regions SS1, SS2, SS3, SS4, and SS5 may be included.

The third vertical structures VS3 respectively contacting the upper separation region SS may allow gate electrodes 130 disposed in the upper separation region SS to be stably formed. Therefore, the number of upper separation regions in the upper separation region SS between the separation regions MS1 and MS2 may be freely changed.

Figure 7:
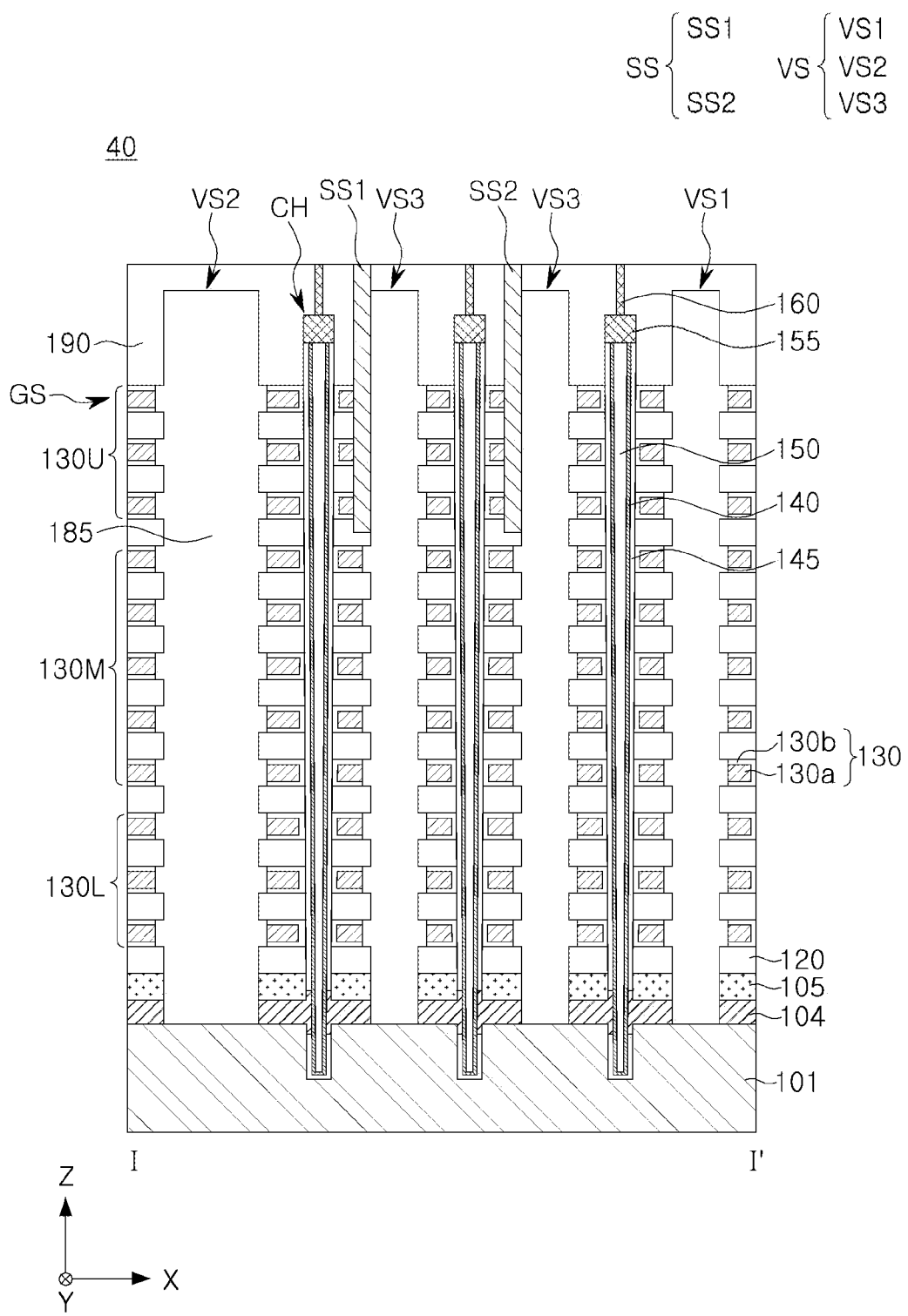
FIG. 7 is a cross-sectional view schematically illustrating a semiconductor device according to some example embodiments.

FIG. 7 is a cross-sectional view schematically illustrating a semiconductor device according to some example embodiments.

Referring to FIG. 7, in a semiconductor device 40, an upper surface of an upper separation region SS may be disposed on a higher level than an upper surface of a vertical structure VS. A lateral surface of the upper separation region SS may be disposed in a same manner to a lateral surface of an interlayer insulating layer 120, but is not limited thereto. The lateral surface of the upper separation region SS may further protrude in a direction facing the vertical structure VS, as compared to the lateral surface of the interlayer insulating layer 120. A gate electrode 130 contacting the upper separation region SS may include a first layer 130a having any lateral surface contacting the upper separation region SS, and a second layer 130b covering upper and lower surfaces of the first layer 130a and covering a lateral surface of the first layer 130a that do not contact the upper separation region SS.

Figure 8A:
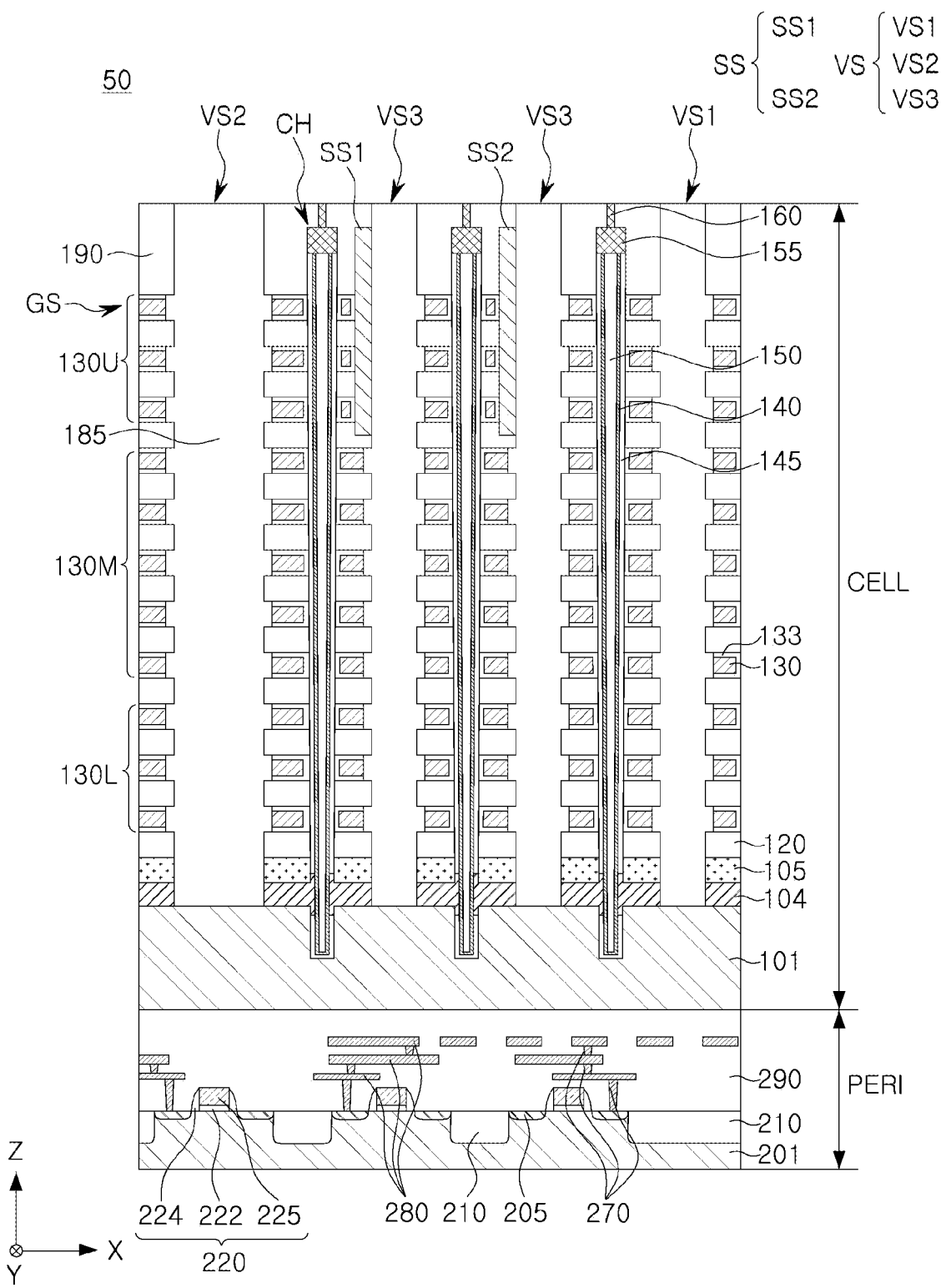
FIG. 8A is a cross-sectional view schematically illustrating a semiconductor device according to some example embodiments.

FIG. 8A is a cross-sectional view schematically illustrating a semiconductor device according to some example embodiments.

Referring to FIG. 8A, a semiconductor device 50 may include a peripheral circuit structure PERI including a base substrate 201 and a memory cell structure CELL including a substrate 101. The memory cell structure CELL may be disposed on the peripheral circuit structure PERI.

The peripheral circuit structure PERI may include a base substrate 201, source/drain regions 205 and device isolation layers 210, in the base substrate 201, and circuit devices 220 (e.g., peripheral circuits), circuit contact plugs 270, circuit wiring lines 280, and a peripheral region insulating layer 290, arranged on the base substrate 201.

The base substrate 201 may have an upper surface extending in the X and Y directions. An active region may be defined by the device isolation layers 210 in the base substrate 201. The source/drain regions 205 including impurities may be disposed in a portion of the active region. The base substrate 201 may include a semiconductor material, such as a group IV semiconductor, a group III-V compound semiconductor, or a group II-VI compound semiconductor. The base substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 in the base substrate 201 may be disposed on both sides of the circuit gate electrode 225.

The peripheral region insulating layer 290 may be disposed on the circuit device 220 on the base substrate 201. The circuit contact plugs 270 may pass through the peripheral region insulating layer 290, and may be connected to the source/drain regions 205. An electric signal may be applied to the circuit devices 220 by the circuit contact plugs 270. In a region not illustrated, the circuit contact plugs 270 may be connected to the circuit gate electrode 225. The circuit wiring lines 280 may be connected to the circuit contact plugs 270, and may be disposed as a plurality of layers.

The semiconductor device 50 may be prepared by forming the peripheral circuit structure PERI, forming the substrate 101 of the memory cell structure CELL, and forming the memory cell structure CELL. The substrate 101 may have the same size as the base substrate 201, or may be formed smaller than the base substrate 201.

In this way, a configuration in which the memory cell structure CELL and the peripheral circuit structure PERI are vertically stacked may be applied to some example embodiments of FIGS. 4 to 7. For other configurations, the description described above with reference to FIGS. 1 to 3 may be equally applied.

Figure 8B:
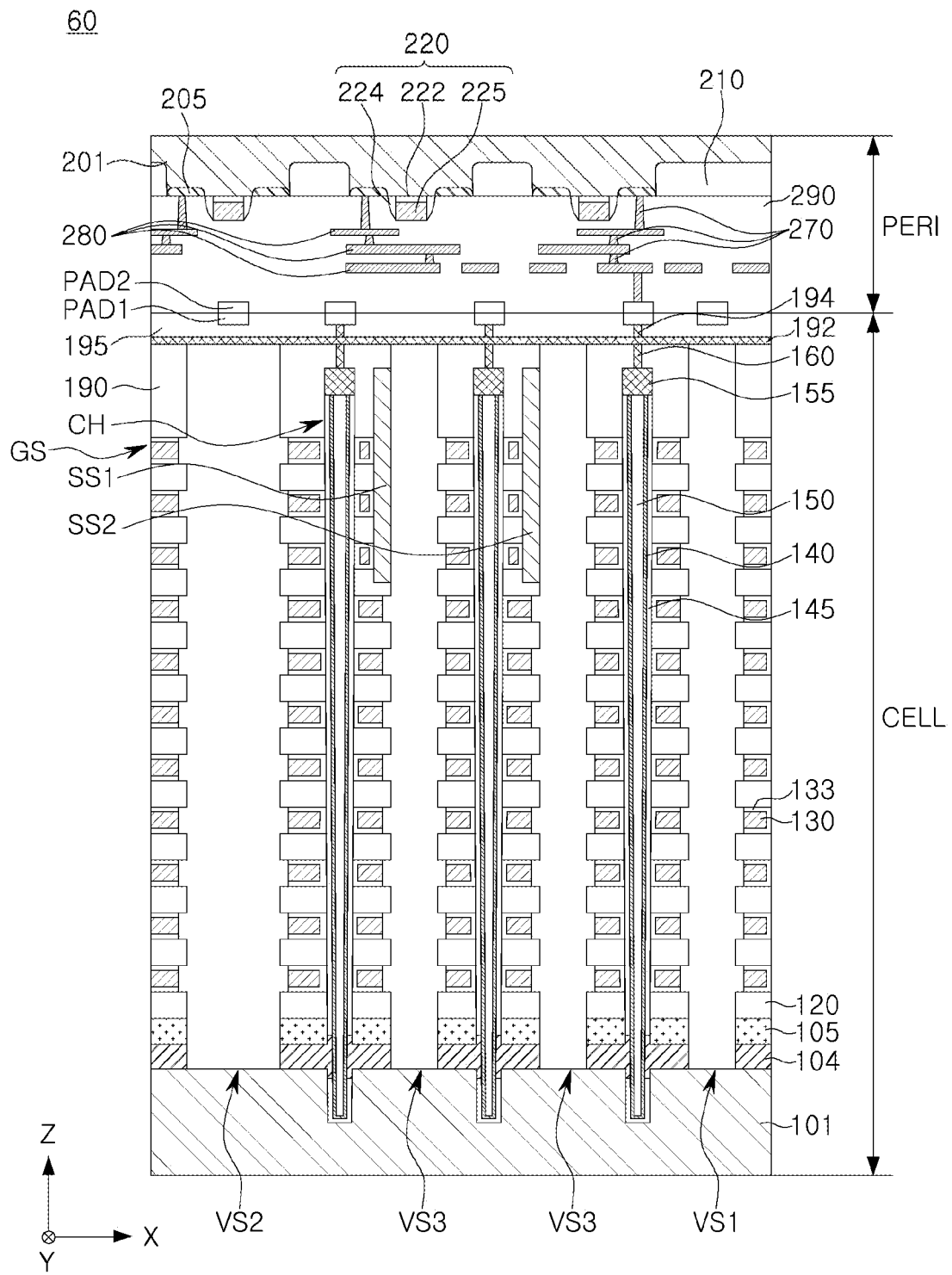
FIG. 8B is a cross-sectional view schematically illustrating a semiconductor device according to some example embodiments.

FIG. 8B is a cross-sectional view schematically illustrating a semiconductor device according to some example embodiments.

Referring to FIG. 8B, in a semiconductor device 60, a memory cell structure CELL may be disposed below a peripheral circuit structure PERI.

The memory cell structure CELL may further include bit lines 192 disposed on the channel contact plug 160, and an upper insulating layer 195 and an upper vertical wiring 194, disposed on the cell region insulating layer 190, in the semiconductor device 10 described in FIGS. 1 to 3. Also, the memory cell structure CELL may further include first bonding pads PAD1. At least a portion of the first bonding pads PAD1 may be disposed between the bit lines 192 and the peripheral circuit structure PERI. The peripheral circuit structure PERI may further include second bonding pads PAD2 in a region corresponding to the first bonding pads PAD1 of the memory cell structure CELL. The second bonding pads PAD2 may be in contact with and bonded to the first bonding pads PAD1. A peripheral circuit (e.g., circuit devices 220) may be disposed on the second bonding pads PAD2, and a base substrate 201 may be disposed on the peripheral circuit.

The channel contact plug 160, the bit lines 192, and the upper vertical wiring 194 may be electrically connected to each other. The bit lines 192 may be electrically connected to a plurality of channel vertical structures CH between the peripheral circuit structure PERI and a stack structure GS.

The upper insulating layer 195 may be formed of an insulating material. The upper vertical wiring 194 and the bit lines 192 may be formed of a conductive material. The first bonding pad PAD1 and the second bonding pad PAD2 may include a conductive material, for example, copper (Cu) or the like. In some example embodiments, the memory cell structure CELL and the peripheral circuit structure PERI may be bonded by, for example, copper (Cu)-to-copper (Cu) bonding.

Figure 9:
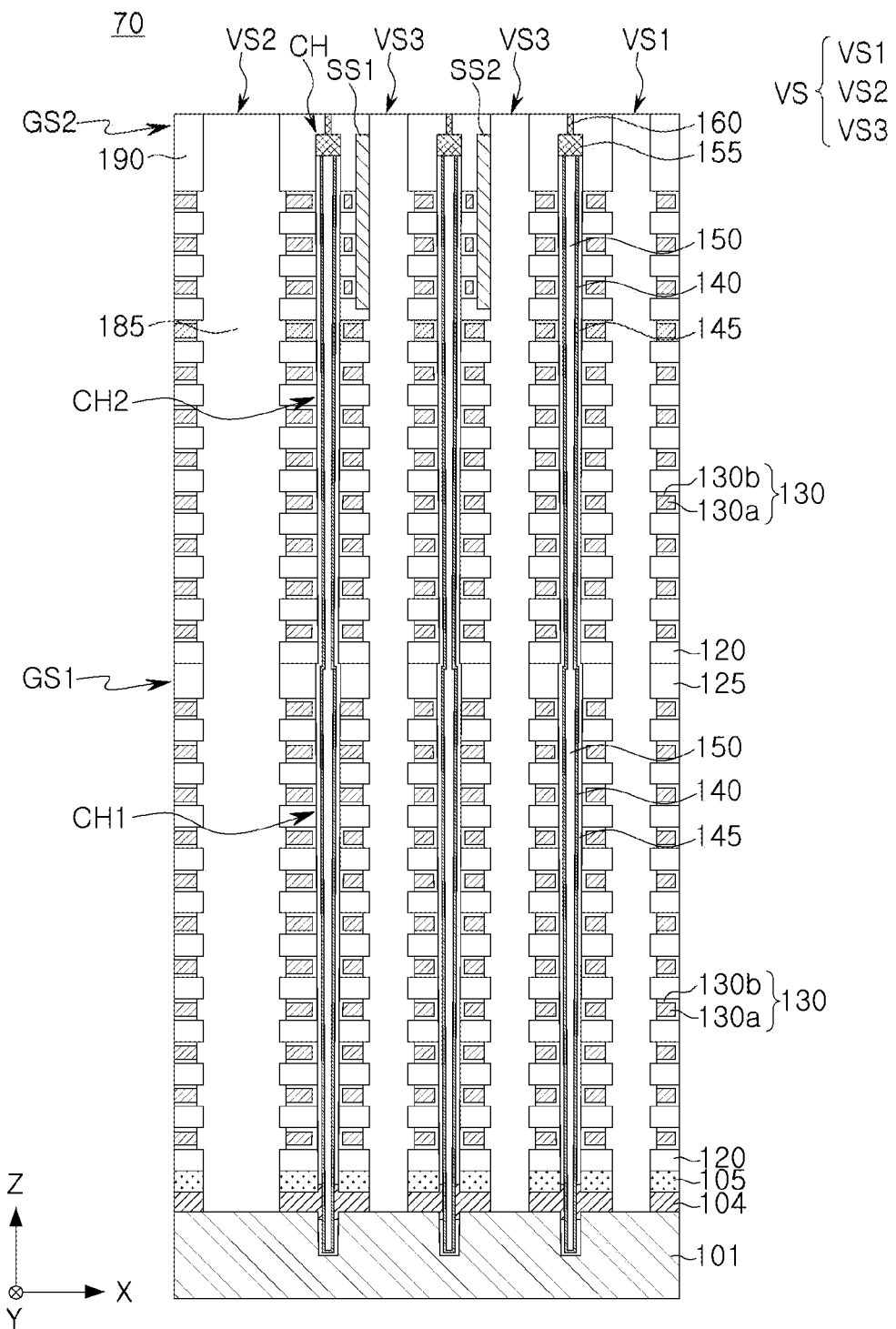
FIG. 9 is a cross-sectional view schematically illustrating a semiconductor device according to some example embodiments.

FIG. 9 is a cross-sectional view schematically illustrating a semiconductor device according to some example embodiments.

Referring to FIG. 9, a semiconductor device 70 may include a lower stack structure GS1 and an upper stack structure GS2, in which gate electrodes 130 are vertically stacked, respectively. Also, a channel structure CH may include lower channel structures CHL passing through the lower stack structure GS1, and upper channel structures CHU passing through the upper stack structure GS2. A structure of such a channel structure CH may be introduced to stably form the channel structure CH, when the number of the gate electrodes 130 stacked is relatively large.

The channel structure CH may have a form in which the lower channel structures CHL of the lower stack structure GS1 and the upper channel structures CHU of the upper stack structure GS2 are connected, and may have a bent portion due to a difference in width in a region in which the connection is performed. A channel layer 140 and a channel embedded insulating layer 150 may be connected to each other between each of the lower channel structures CHL and each of the upper channel structures CHU. A channel pad 155 may be disposed only on each of the upper channel structures CHU. In some example embodiments, the lower channel structure CHL and the upper channel structure CHU may include the channel pad 155, respectively. In this case, the channel pad 155 of each of the lower channel structure CHL may be connected to the channel layer 140 of each of the upper channel structure CHU. An upper interlayer insulating layer 125 having a relatively thick thickness may be disposed in an uppermost portion of the lower stack structure GS1. Shapes of interlayer insulating layers 120 and a shape of the upper interlayer insulating layer 125 may be variously changed in some example embodiments.

Vertical structures VS are illustrated in a form connected without a difference in width in a region in which the lower stack structure GS1 and the upper stack structure GS2 are connected, but the present inventive concepts is not limited thereto. In some example embodiments, similarly to the channel structure CH, the vertical structures VS may have a bent portion due to a difference in width.

For other configurations, the description described above with reference to FIGS. 1 to 3 may be equally applied.

FIGS. 10A to 10D schematically illustrate a method of manufacturing a semiconductor device according to some example embodiments.

Referring to FIG. 10A, first and second source sacrificial layers 111 and 112 and a second horizontal conductive layer 105 may be formed on a substrate 101, and horizontal insulating layers 110 and interlayer insulating layers 120 may be alternately stacked to form a stack structure.

First, the first and second source sacrificial layers 111 and 112 may include different materials, and may be stacked on the substrate 101 to dispose the first source sacrificial layer 111 above and below the second source sacrificial layer 112. The first and second source sacrificial layers 111 and 112 may be layers to be replaced with the first horizontal conductive layer 104 of FIG. 2 by a subsequent process. For example, the first source sacrificial layer 111 may be formed of the same material as the interlayer insulating layers 120, and the second source sacrificial layer 112 may be formed of the same material as the horizontal insulating layers 110. The second horizontal conductive layer 105 may be deposited on the first and second source sacrificial layers 111 and 112.

Next, the horizontal insulating layers 110 and the interlayer insulating layers 120 may be alternately stacked on the second horizontal conductive layer 105 to form a stack structure.

The horizontal insulating layers 110 may be layers to be replaced with gate electrodes 130 by a subsequent process. The horizontal insulating layers 110 may be formed of a material, different from the interlayer insulating layers 120. For example, the interlayer insulating layer 120 may be formed of at least one of silicon oxide and silicon nitride, and the horizontal insulating layers 110 may be formed of a material, different from the interlayer insulating layer 120, selected from silicon, silicon oxide, silicon carbide, and silicon nitride. In some example embodiments, the interlayer insulating layers 120 may not all have the same thickness. For example, a lowermost interlayer insulating layer 120 may be formed to be relatively thin, and an uppermost interlayer insulating layer 120 may be formed to be relatively thick. Thicknesses of the interlayer insulating layers 120 and the horizontal insulating layers 110, and the number of layers constituting them may be variously changed from those illustrated. A cell region insulating layer 190 may be formed in an uppermost portion of the stack structure.

Referring to FIG. 10B, upper separation regions SS1 and SS2 and channel structures CH may be formed.

First, a predetermined number of the horizontal insulating layers 110 and the interlayer insulating layers 120 may be removed from the uppermost portion of the stack structure using a separate mask layer, to form upper separation regions SS1 and SS2. In this case, the upper separation regions SS1 and SS2 may be formed to have a zigzag shape, as illustrated in FIG. 1. The upper separation regions SS1 and SS2 may be formed by depositing an insulating material in a region from which the horizontal insulating layers 110 and the interlayer insulating layers 120 are removed. The upper separation regions SS1 and SS2 may be formed of a material having etch selectivity with respect to the horizontal insulating layers 110, together with the interlayer insulating layer 120, and, for example, may be formed of the same material as the interlayer insulating layer 120.

Next, in order to form channel structures CH, an etching process may be performed at positions corresponding to the channel structures CH of FIG. 2, to form channel holes. The channel holes may be formed to have a channel hole, relatively close to an upper separation region SS, and a channel hole, relatively far from the upper separation region SS, with the upper separation region SS interposed therebetween. The channel holes may be formed by anisotropically etching the stack structure, and may be formed in a hole shape. Due to a height of the stack structure, sidewalls of the channel holes may not be perpendicular to an upper surface of the substrate 101. The channel holes may be formed to recess a portion of the substrate 101. Next, a channel layer 140, a channel embedded insulating layer 150, and a gate dielectric layer 145 may be embedded in the channel holes to form channel structures CH.

Referring to FIG. 10C, openings OP1 and OP2 having different widths may be formed at positions corresponding to the vertical structures VS of FIG. 2.

An etching process may be performed in regions corresponding to the vertical structures VS1, VS2, and VS3 of FIG. 2, respectively, to form first and second openings OP1 and OP2. An opening (e.g., OP2), at least a portion of the first and second openings OP1 and OP2, may have a width W1, wider than a width W2 of a remaining opening. In an etching process for forming the first and second openings OP1 and OP2, a portion of the upper separation regions SS1 and SS2 may be removed together.

The second source sacrificial layer 112 may be exposed by performing an etch-back process while forming separate sacrificial spacer layers in the openings OP1 and OP2. The second source sacrificial layer 112 may be selectively removed from the exposed region, and the first source sacrificial layers 111 above and below the second source sacrificial layer 112 may be then removed.

The first and second source sacrificial layers 111 and 112 may be removed by, for example, a wet etching process. During the removal process of the first and second source sacrificial layers 111 and 112, a portion of the gate dielectric layer 145 exposed in a region from which the second source sacrificial layer 112 is removed may also be removed. A conductive material may be deposited in a region from which the first and second source sacrificial layers 111 and 112 are removed, to form a first horizontal conductive layer 104, and the sacrificial spacer layers may be then removed from the openings.

Next, the horizontal insulating layers 110 may be selectively removed with respect to the interlayer insulating layers 120 and the second horizontal conductive layer 105 by a wet etching process. Therefore, a plurality of tunnel portions may be formed between the interlayer insulating layers 120.

Figure 10D:
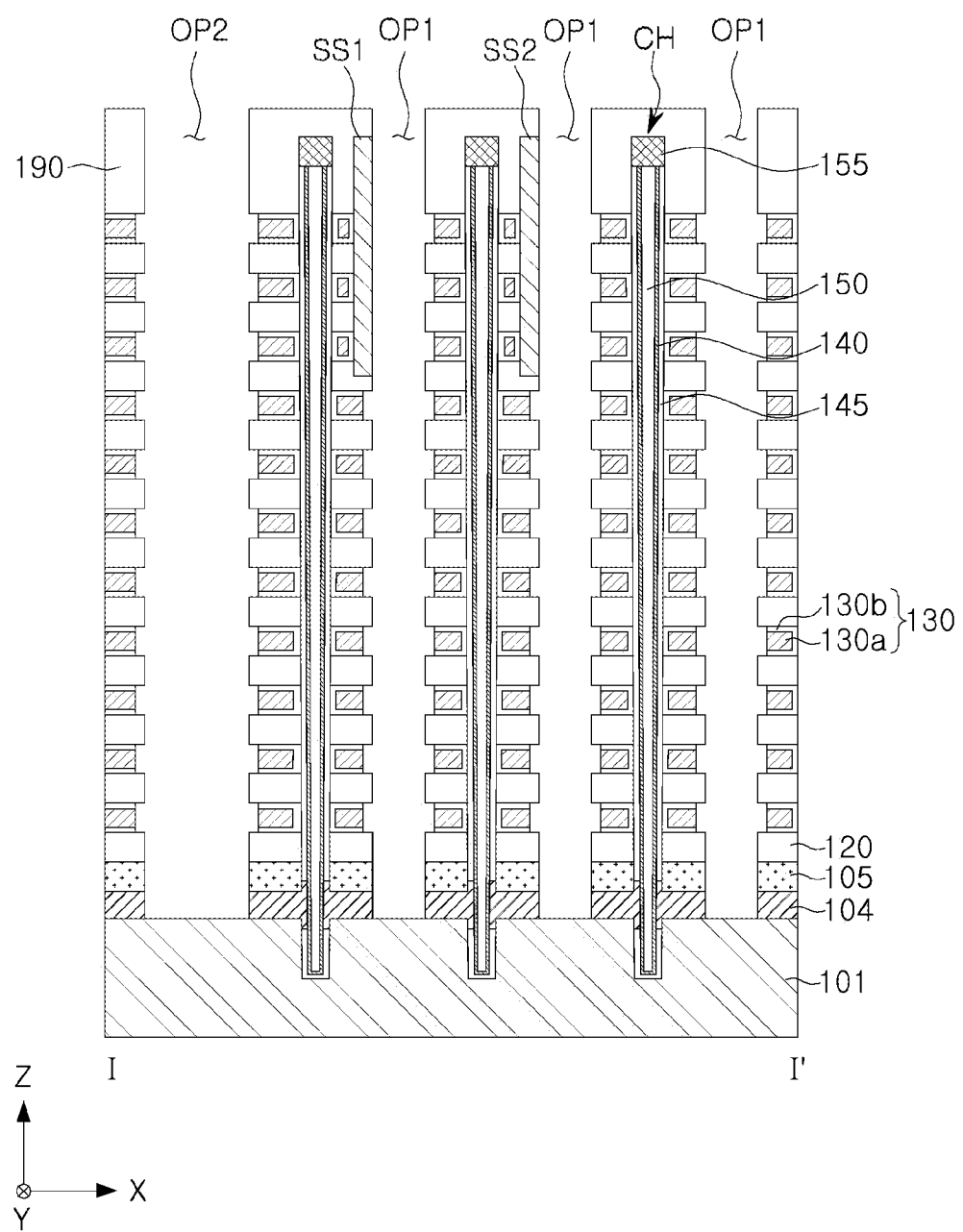

Referring to FIG. 10D, the plurality of tunnel portions of FIG. 10C may be filled with a conductive material to form gate electrodes 130. The conductive material may include a metal, polycrystalline silicon, or metal silicide material. Since the upper separation regions SS1 and SS2 may block lateral surfaces of the tunnel portions from which the horizontal insulating layer 110 is removed from at least a portion of the openings, in the gate electrode 130 between the upper separation regions SS1 and SS2 and between the channel structures CH, a second layer 130b may be formed to cover a lateral surface of a first layer 130a facing the upper separation region SS and the channel structures CH.

Referring again to FIG. 2, the vertical structures VS may be formed by filling the insulating pattern 185 made of an insulating material in the first and second openings OP1 and OP2. Since the first and second openings OP1 and OP2 may be formed slower than the upper separation regions SS1 and SS2, upper surfaces of the vertical structures VS may be disposed on a higher level than the upper separation regions SS1 and SS2.

Figure 11A:
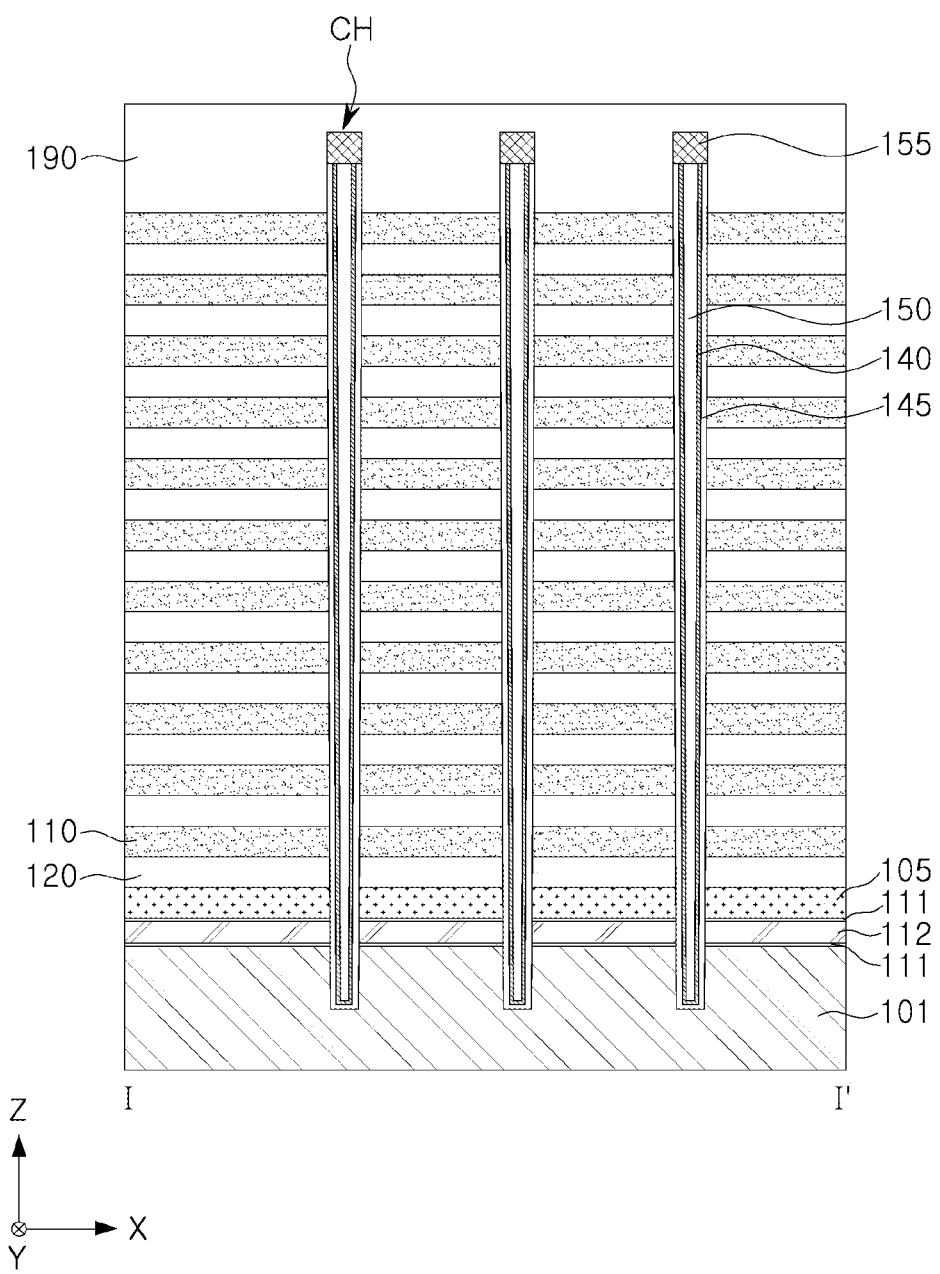
FIGS. 11A, 11B, and 11C schematically illustrate a method of manufacturing a semiconductor device according to some example embodiments.
Figure 11B:
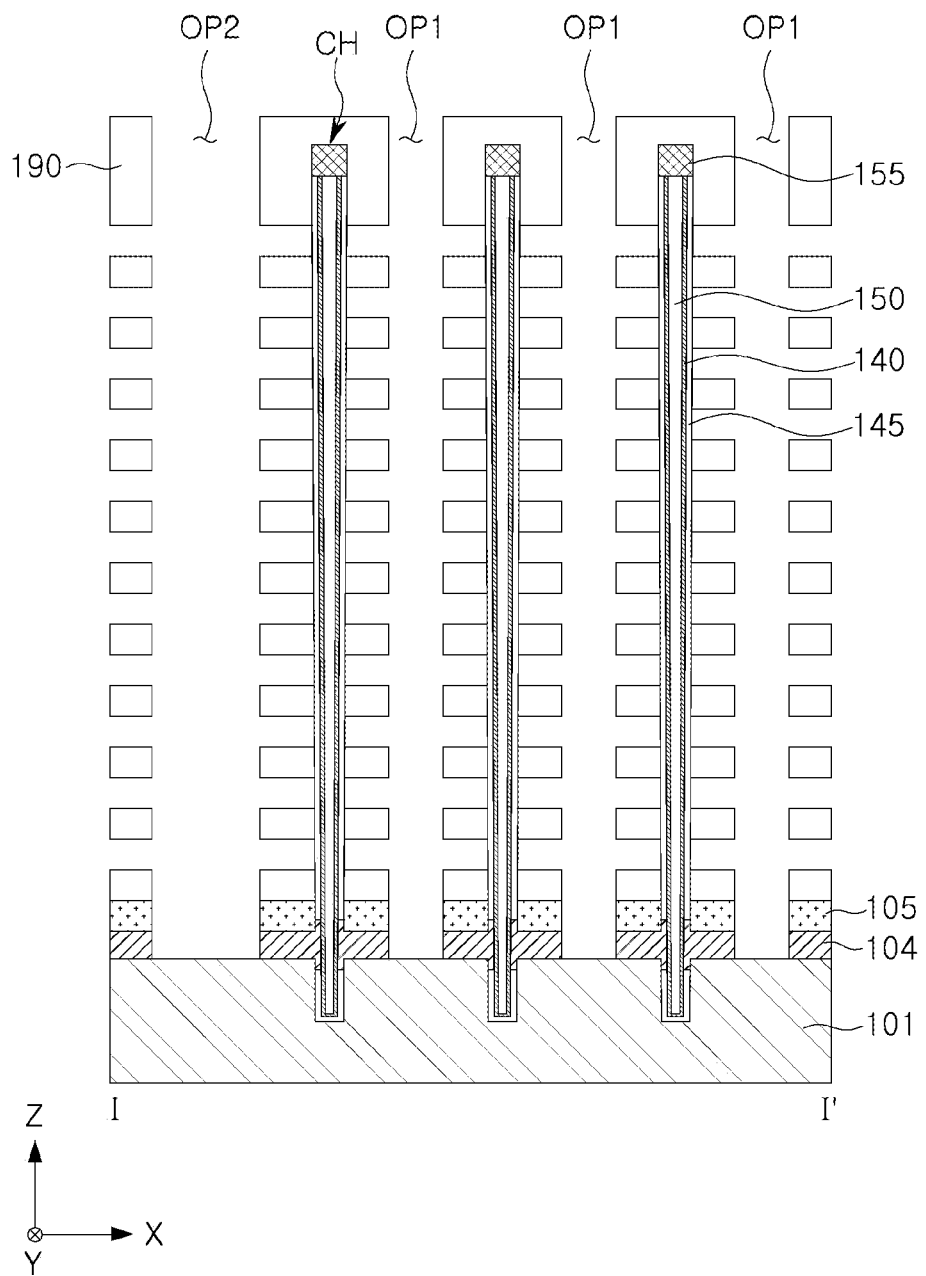
Figure 11C:
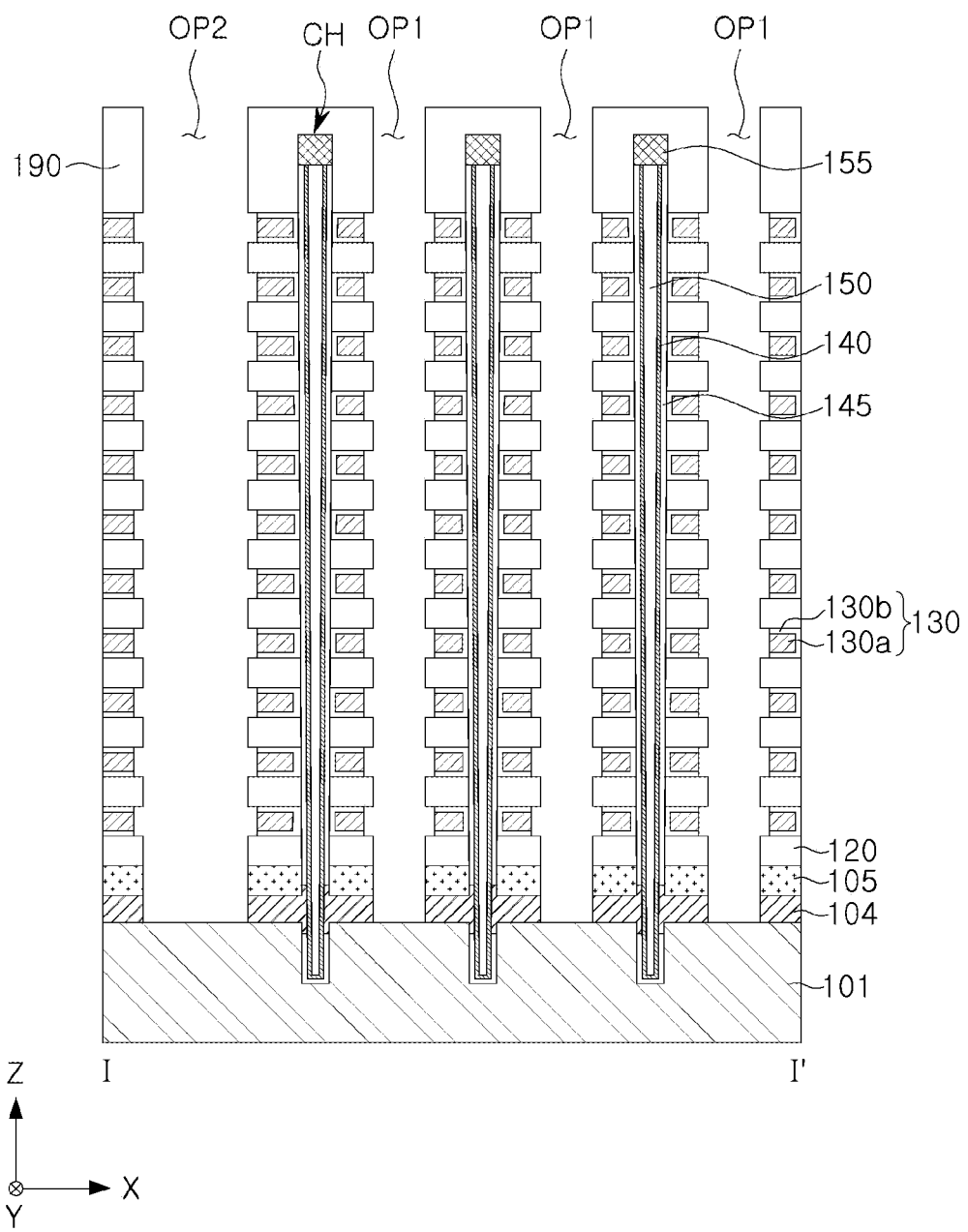

FIGS. 11A to 11C schematically illustrate a method of manufacturing a semiconductor device according to some example embodiments.

Referring to FIG. 11A, after the stack structure of FIG. 10A is formed, channel structures CH passing through the stack structure may be formed. The channel structures CH may be formed in the same manner as described in FIG. 10B.

Referring to FIG. 11B, openings OP1 and OP2 having different widths may be formed in the same manner as described in FIG. 10C. Unlike FIG. 10C, since upper separation regions SS1 and SS2 are not formed earlier than the openings OP1 and OP2, in FIG. 11C, only a tunnel portion from which a horizontal insulating layer 110 is removed may be formed between the openings OP1 and OP2 and the channel structures CH.

Referring to FIG. 11C, gate electrodes 130 may be formed in the same manner as described in FIG. 10D. Unlike FIG. 10D, since the upper separation regions SS1 and SS2 do not block between the openings OP1 and OP2 and the channel structures CH, any one lateral surface of a first layer 130a of the gate electrodes 130 disposed on the stack structure may be formed to be exposed to the opening OP1.

Referring back to FIG. 7, after the gate electrodes 130 are formed, the upper separation regions SS1 and SS2 may be formed by removing upper portions of the gate electrodes 130 and a portion of the interlayer insulating layer 120.

Figure 12:
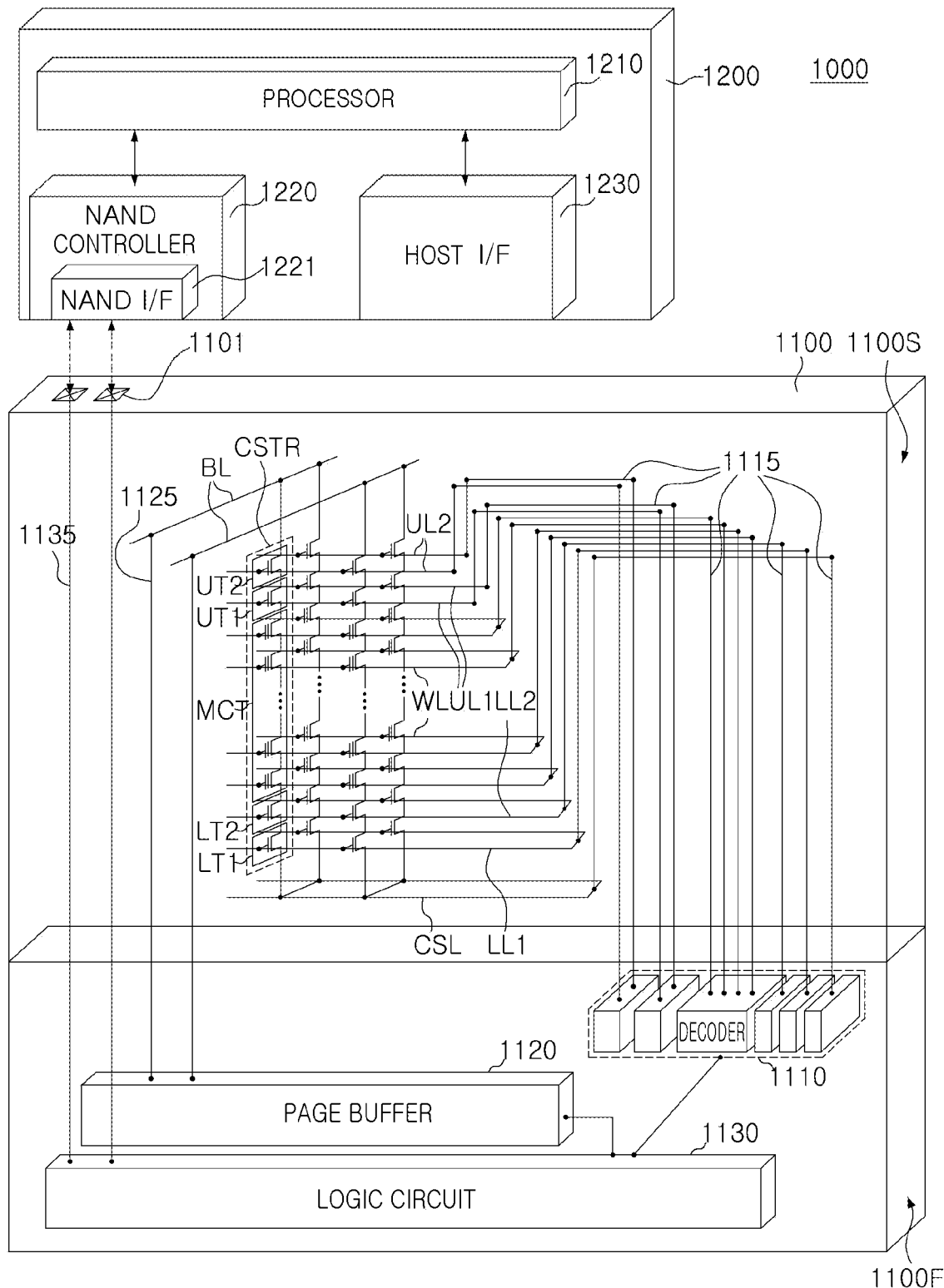
FIG. 12 is a view schematically illustrating a data storage system including a semiconductor device according to some example embodiments.

FIG. 12 is a view schematically illustrating a data storage system including a semiconductor device according to some example embodiments.

Referring to FIG. 12, a data storage system 1000 according to some example embodiments of the present inventive concepts may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive device (SSD), a universal serial bus (USB), a computing system, a medical device, or a communication device, including one or more semiconductor devices 1100.

The semiconductor device 1100 may be a non-volatile memory device, for example, a NAND flash memory device described above with reference to FIGS. 1 to 9. The semiconductor device 1100 may include a first structure 1100F, and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to some example embodiments.

In some example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210 (e.g., a central processing unit, or CPU), a NAND controller 1220, and a host interface 1230. According to some example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

The controller 1200 and/or semiconductor device 1100, and/or any portions thereof, may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), storing a program of instructions, and a processor (e.g., CPU) configured to execute the program of instructions to implement the functionality and/or methods performed by some or all of the controller 1200 and/or semiconductor device 1100, and/or any portion thereof.

Figure 13:
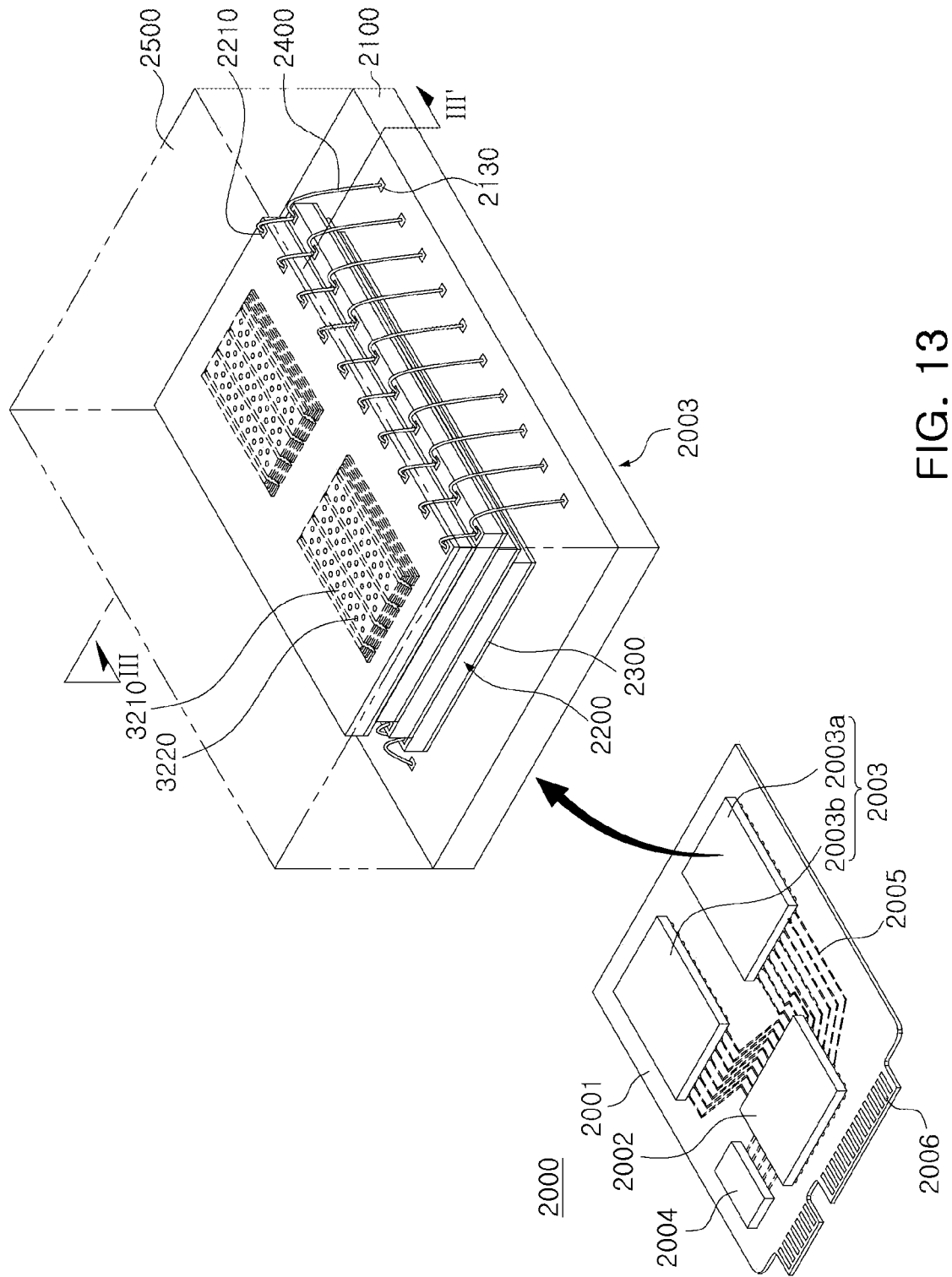
FIG. 13 is a perspective view schematically illustrating a data storage system including a semiconductor device according to some example embodiments.

FIG. 13 is a perspective view schematically illustrating a data storage system including a semiconductor device according to some example embodiments.

Referring to FIG. 13, a data storage system 2000 according to some example embodiments of the present inventive concepts may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In some example embodiments, the data storage system 2000 may be communicated with the external host according to any one interface of a universal serial bus (USB), peripheral component interconnection express (PCIe), serial advanced technology attachment (SATA), M-Phy for universal flash storage (UFS), or the like. In some example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 12. Each of the semiconductor chips 2200 may include gate stack structures 3210 and memory channel structures 3220. Each of the semiconductor chips 2200 may include a semiconductor device according to any one of the embodiments described above with reference to FIGS. 1 to 11C.

In some example embodiments, the connection structure 2400 may be a bonding wire electrically connecting the input/output pad 2210 and the package upper pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to some example embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In some example embodiments, the controller 2002 and the semiconductor chips 2200 may be included in one (1) package. In some example embodiments, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 14:
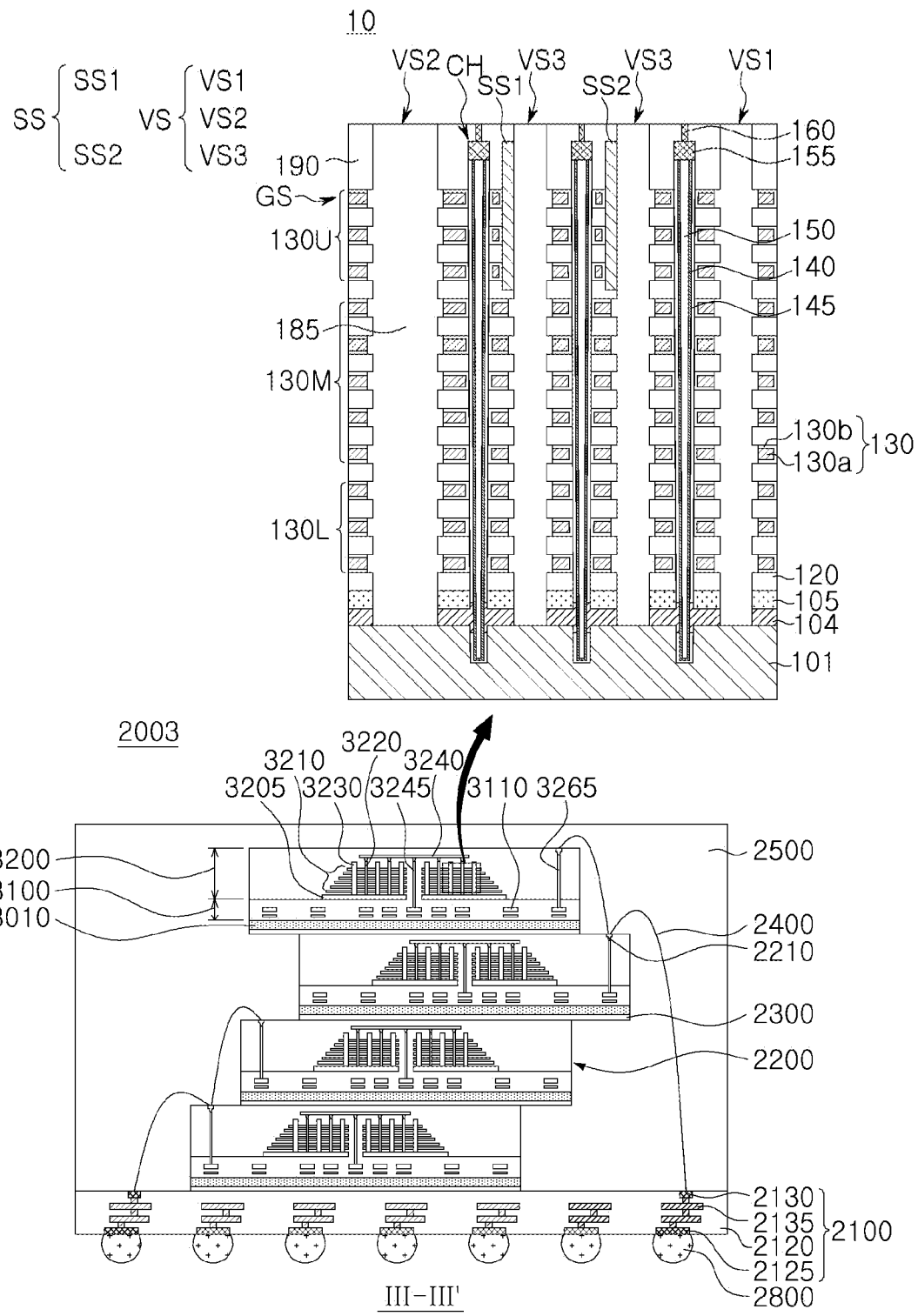
FIG. 14 is a cross-sectional view schematically illustrating a semiconductor package according to some example embodiments.

FIG. 14 is a cross-sectional view schematically illustrating a semiconductor package according to some example embodiments. FIG. 14 illustrates some example embodiments of the semiconductor package 2003 of FIG. 13, and conceptually illustrates a region taken along line III-III' of the semiconductor package 2003 of FIG. 13.

Referring to FIG. 14, in the semiconductor package 2003, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wirings 2135 electrically connecting the package upper pads 2130 and the lower pads 2125 in the package substrate body portion 2120. The package upper pads 2130 may be electrically connected to the connection structures 2400. The lower pads 2125 may be connected to the wiring patterns 2005 of the main substrate 2001 of the data storage system 2000, as illustrated in FIG. 13, through the conductive connection parts 2800.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation regions 3230, passing through the gate stack structure 3210, bit lines 3240 electrically connected to the memory channel structures 3220, and gate connection wirings electrically connected to the word lines (WL of FIG. 12) of the gate stack structure 3210. Each of the first structure 3100, the second structure 3200, and the semiconductor chips 2200 may further include vertical structures VS1, VS2, and VS3, as illustrated in the enlarged view.

Each of the semiconductor chips 2200 may include a through-wiring 3245 electrically connected to the peripheral wirings 3110 of the first structure 3100 and extending into the second structure 3200. The through-wiring 3245 may pass through the gate stack structure 3210, and may be further disposed outside the gate stack structure 3210. Each of the semiconductor chips 2200 may further include an input/output connection wiring 3265 electrically connected to the peripheral wirings 3110 of the first structure 3100 and extending into the second structure 3200, and an input/output pad 2210 electrically connected to and the input/output connection wiring 3265.

In FIG. 14, a partially enlarged portion of a semiconductor device 10 is provided to illustrate that each of the semiconductor chips 2200 illustrated in FIG. 14 may be deformed to include the cross-sectional structure illustrated in FIG. 2. Therefore, each of the semiconductor chips 2200 may include a semiconductor device according to any one of the above-described embodiments with reference to FIGS. 1 to 11C.

A semiconductor device having improved reliability and a data storage system including the same may be provided by arranging vertical structures forming a gate electrode to pass through separation regions.

Various advantages and effects of the present inventive concepts are not limited to the above description, and can be more easily understood in the process of describing specific embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
a substrate;
a stack structure on the substrate, the stack structure including an alternating stack of interlayer insulating layers and gate electrodes;
a first separation region and a second separation region, each of the first separation region and the second separation region extending through the stack structure, such that the first separation region and the second separation region are connected to the substrate and extend in a first direction;
a first upper separation region between the first separation region and the second separation region and extending through a portion of the stack structure;
a plurality of channel structures between the first separation region and the second separation region and extending through the stack structure; and
a plurality of first vertical structures respectively extending through the first separation region and the second separation region,
wherein each of the first and second separation regions has a first width in a second direction, the second direction being perpendicular to the first direction, and
wherein each of the plurality of first vertical structures has a second width in the second direction, the second width being greater than the first width.

2. The semiconductor device of claim 1, further comprising:
a plurality of second vertical structures respectively extending through the first and second separation regions,
wherein each of the plurality of second vertical structures has a third width, greater than the second width, in the second direction, and
the plurality of second vertical structures and the plurality of first vertical structures are alternately arranged in the first direction.

3. The semiconductor device of claim 1, further comprising a third vertical structure extending through the stack structure and contacting the first upper separation region.

4. The semiconductor device of claim 3, wherein the third vertical structure is isolated from direct contact with any one lateral surface among opposite lateral surfaces of the first upper separation region.

5. The semiconductor device of claim 3, wherein a width of the third vertical structure is substantially identical to the second width of each of the plurality of first vertical structures.

6. The semiconductor device of claim 1, wherein
the plurality of channel structures includes a first channel structure and a second channel structure,
one first vertical structure among the plurality of first vertical structures, the first channel structure, and the second channel structure are sequentially arranged in a third direction, the third direction being a diagonal direction between the first direction and the second direction,
the first channel structure is adjacent to the one first vertical structure in the third direction, and the first channel structure is between the one first vertical structure and the second channel structure,
a center of the first channel structure is spaced apart from a center of the one first vertical structure by a first distance, and
a center of the second channel structure is spaced apart from the center of the first channel structure by a second distance, the second distance being less than the first distance.

7. The semiconductor device of claim 6, wherein
the plurality of channel structures further includes a third channel structure and a fourth channel structure,
the third channel structure is adjacent to the one first vertical structure in a fourth direction, the fourth direction being perpendicular to the third direction, the third channel structure is adjacent to the first channel structure in the first direction, and the third channel structure is between the fourth channel structure and the first channel structure,
a center of the third channel structure is spaced apart from the center of the first channel structure by a third distance in the first direction, and a center of the fourth channel structure is spaced apart from the center of the third channel structure by a fourth distance in the first direction, the fourth distance being less than the third distance.

8. The semiconductor device of claim 1, wherein
the plurality of channel structures includes a first channel structure and a second channel structure,
one first vertical structure among the plurality of first vertical structures, the first channel structure, and the second channel structure are sequentially arranged in a third direction, the third direction being a diagonal direction between the first direction and the second direction,
the first channel structure is adjacent to the one first vertical structure in the third direction, and the first channel structure is between the one first vertical structure and the second channel structure,
a center of the first channel structure is spaced apart from a center of the one first vertical structure by a first distance, and
a center of the second channel structure is spaced apart from the center of the first channel structure by a second distance, the second distance being substantially equal to the first distance.

9. The semiconductor device of claim 8, wherein
the plurality of channel structures further includes a third channel structure and a fourth channel structure,
the third channel structure is adjacent to the one first vertical structure in a fourth direction, the fourth direction being perpendicular to the third direction, the third channel structure being adjacent to the first channel structure in the first direction, and the third channel structure being between the fourth channel structure and the first channel structure,
a center of the third channel structure is spaced apart from the center of the first channel structure by a third distance in the first direction, and
a center of the fourth channel structure is spaced apart from the center of the third channel structure by a fourth distance in the first direction, the fourth distance being substantially equal to the third distance.

10. The semiconductor device of claim 1, wherein
the plurality of channel structures includes at least three channel structures sequentially arranged in the second direction,
a portion of the first upper separation region is between a pair of channel structures adjacent to each other in the second direction, among the at least three channel structures, and
a distance between the pair of channel structures is greater than a distance between any one channel structure adjacent to the pair of channel structures in the second direction and the pair of channel structures.

11. The semiconductor device of claim 1, further comprising a second upper separation region between the first upper separation region and the second separation region.

12. The semiconductor device of claim 1, wherein a width of each of the plurality of first vertical structures in the first direction is different from the second width of each of the plurality of first vertical structures in the second direction.

13. The semiconductor device of claim 1, further comprising:
a peripheral circuit structure including a base substrate and a peripheral circuit on the base substrate,
wherein the substrate is on the peripheral circuit structure.

14. The semiconductor device of claim 1, further comprising:
a peripheral circuit structure;
bit lines; and
first bonding pads,
wherein the bit lines are electrically connected to the plurality of channel structures between the peripheral circuit structure and the stack structure,
at least a portion of the first bonding pads are between the bit lines and the peripheral circuit structure, and
the peripheral circuit structure includes second bonding pads contacting and bonded to the first bonding pads, a peripheral circuit on the second bonding pads, and a base substrate on the peripheral circuit.

15. A semiconductor device, comprising:
a substrate;
a stack structure on the substrate, the stack structure including an alternating stack of interlayer insulating layers and gate electrodes, alternately stacked in a direction perpendicular to an upper surface of the substrate;
separation regions having a first width and extending through the stack structure, such that the separation regions are connected to the substrate and further extend in a first direction;
a plurality of channel structures extending through the stack structure; and
a plurality of vertical structures extending through the stack structure,
wherein at least one vertical structure among the plurality of vertical structures extends through at least one separation region of the separation regions, and
wherein the at least one vertical structure among the plurality of vertical structures has a second width greater than the first width.

16. The semiconductor device of claim 15, further comprising:
a plurality of upper separation regions between the separation regions and extending through a portion of the stack structure,
wherein at least a portion of the plurality of vertical structures extend through one or more upper separation regions of the plurality of upper separation regions, and
the plurality of vertical structures and the plurality of channel structures are alternately arranged in a second direction, the second direction being perpendicular to the first direction.

17. The semiconductor device of claim 15, wherein
each of the separation regions has the first width in a second direction, the second direction being perpendicular to the first direction, and
each of the plurality of vertical structures have the second width in the second direction.

18. The semiconductor device of claim 15, wherein
the plurality of channel structures includes a first channel structure and a second channel structure,
the first channel structure is adjacent to one vertical structure among the plurality of vertical structures in the first direction and in a third direction, the third direction being a diagonal direction between the first direction and a second direction, the second direction being perpendicular to the first direction,
the second channel structure is adjacent to the first channel structure in the third direction,
a center of the first channel structure is spaced apart from a center of the one vertical structure by a first distance, and a center of the second channel structure is spaced apart from the center of the first channel structure by a second distance, the second distance being less than the first distance.

19. A data storage system, comprising:
a semiconductor storage device; and
a controller electrically connected to the semiconductor storage device, the controller configured to control the semiconductor storage device,
wherein the semiconductor storage device includes
a substrate;
a stack structure on the substrate, the stack structure including an alternating stack of interlayer insulating layers and gate electrodes, alternately stacked in a direction perpendicular to an upper surface of the substrate;
separation regions having a first width and extending through the stack structure, such that the separation regions are connected to the substrate and extend in a first direction;
a plurality of channel structures extending through the stack structure; and
a plurality of vertical structures extending through the stack structure, and
wherein at least one vertical structure among the plurality of vertical structures has a second width greater than the first width and extends through at least one separation region of the separation regions.

20. The data storage system of claim 19, wherein
the semiconductor storage device further includes a plurality of upper separation regions between the separation regions and extending through a portion of the stack structure, and
each of the separation regions has the first width in a second direction, the second direction being perpendicular to the first direction, and each of the plurality of vertical structures has the second width in the second direction.

* * * * *